US008884646B2

(12) United States Patent
Kalb et al.

(10) Patent No.: US 8,884,646 B2
(45) Date of Patent: *Nov. 11, 2014

(54) ELECTRICAL NETWORKS AND METHODS OF FORMING THE SAME

(71) Applicant: Analog Devices, Inc., Norwood, MA (US)

(72) Inventors: Arthur J. Kalb, Santa Clara, CA (US); Evaldo M. Miranda, Saratoga, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/084,050

(22) Filed: Nov. 19, 2013

(65) Prior Publication Data

US 2014/0077862 A1   Mar. 20, 2014

Related U.S. Application Data

(63) Continuation of application No. 13/298,210, filed on Nov. 16, 2011, now Pat. No. 8,598,904, which is a continuation of application No. 11/810,517, filed on Jun. 5, 2007, now Pat. No. 8,502,557.

(60) Provisional application No. 60/811,164, filed on Jun. 5, 2006.

(51) Int. Cl.
*H03K 19/003* (2006.01)

(52) U.S. Cl.
USPC .............................................. 326/34; 326/30

(58) Field of Classification Search
CPC .......... H03H 7/38; H03H 7/40; H04B 3/145; H03K 19/00384
USPC ..................................................... 326/30–34
See application file for complete search history.

(56) References Cited

U.S. PATENT DOCUMENTS

| 4,468,607 A | * | 8/1984 | Tanaka et al. ................. 323/354 |
| 4,800,303 A | * | 1/1989 | Graham et al. ................. 326/72 |
| 5,006,854 A | | 4/1991 | White et al. |
| 5,305,004 A | * | 4/1994 | Fattaruso ..................... 341/120 |
| 5,404,142 A | | 4/1995 | Adams et al. |
| 5,684,482 A | | 11/1997 | Galton |

(Continued)

FOREIGN PATENT DOCUMENTS

WO    WO 2006/053098    5/2006

OTHER PUBLICATIONS

Conroy et al., *Statistical Design Techniques for D/A Converters*, IEEE Journal of Solid-State Circuits, vol. 24, No. 4, Aug. 1989, 11 pages.

(Continued)

*Primary Examiner* — Jason M Crawford
(74) *Attorney, Agent, or Firm* — Knobbe, Martens, Olson & Bear, LLP

(57) ABSTRACT

Electrical networks are formed to produce an approximation of at least one desired performance characteristic, based on the recognition that fabrication variations introduce slight differences in electronic sub-networks which were intended to be identical. These fabrication differences are turned to an advantage by providing a pool of sub-networks, and then selectively connecting particular combinations of these sub-networks to implement networks that approximate the desired performance characteristics. The sub-networks are of like kind (e.g., resistors) and have a like measure.

26 Claims, 37 Drawing Sheets

(56) References Cited

U.S. PATENT DOCUMENTS

| | | |
|---|---|---|
| 6,194,962 B1 | 2/2001 | Chen |
| 6,424,211 B1 | 7/2002 | Nolan et al. |
| 6,518,899 B2 | 2/2003 | Yu |
| 6,549,062 B1 | 4/2003 | Washburn et al. |
| 6,696,894 B1 | 2/2004 | Huang |
| 6,697,286 B2 | 2/2004 | Nakagawa |
| 6,744,280 B2* | 6/2004 | Morgan et al. ............... 326/86 |
| 6,756,817 B2* | 6/2004 | Tamura et al. ............... 326/86 |
| 6,812,735 B1* | 11/2004 | Pham ............................ 326/30 |
| 6,960,931 B2 | 11/2005 | Turcotte |
| 7,046,182 B1 | 5/2006 | Ja et al. |
| 7,049,889 B2 | 5/2006 | Kalb |
| 7,173,552 B1 | 2/2007 | Garcia |
| 7,342,411 B2 | 3/2008 | Vergis et al. |
| 7,358,809 B2 | 4/2008 | Elder |
| 7,521,957 B2 | 4/2009 | Koo |
| 7,573,323 B2 | 8/2009 | Moholt et al. |
| 7,733,120 B2* | 6/2010 | Kato et al. ................... 326/30 |
| 7,945,868 B2* | 5/2011 | Pileggi et al. ................ 716/30 |
| 8,598,904 B2* | 12/2013 | Kalb et al. ................... 326/30 |
| 2004/0008054 A1 | 1/2004 | Lesea et al. |
| 2005/0052141 A1 | 3/2005 | Thielemans et al. |
| 2005/0127978 A1* | 6/2005 | Cranford et al. ............. 327/334 |
| 2005/0189961 A1* | 9/2005 | Frans et al. ................... 326/30 |
| 2006/0125563 A1* | 6/2006 | Elder ............................ 330/253 |
| 2009/0160479 A1* | 6/2009 | Lange et al. .................. 326/30 |

OTHER PUBLICATIONS

Garcia, Santiago Iriarte, *16-Bit D/A Converter having Switchable Current Sources and a Current Divider*, University of Limerick, Limerick, Ireland, Oct. 1, 2003.

Carley, L.R., *A noise-shaping coder topology for 15+ bit converters*, IEEE Journal of Solid-State Circuits, vol. 24, No. 2, Apr. 1989.

Leung, B.H., *Architectures for Multi-bit Oversampled A/D Converter Employing Dynamic Element Matching Techniques*, Circuits and Systems, 1991, IEEE International Symposium, pp. 1657-1660, vol. 3, Jun. 11-14, 1991.

Flynn et al., *Digital calibration incorporating redundancy of flash ADCs*, Circuits and Systems II: IEEE Transactions on Analog and Digital Signal Processing, vol. 50, No. 5, pp. 205-213, May 2003.

* cited by examiner

ELECTRICAL NETWORKS AND METHODS OF FORMING THE SAME

CROSS-REFERENCE TO RELATED APPLICATIONS

This application is a continuation of U.S. application Ser. No. 13/298,210, filed Nov. 16, 2011, titled "ELECTRICAL NETWORKS AND METHODS OF FORMING THE SAME", which is a continuation of U.S. application Ser. No. 11/810,517, filed Jun. 5, 2007 titled "APPARATUS AND METHODS FOR FORMING ELECTRICAL NETWORKS THAT APPROXIMATE DESIRED PERFORMANCE CHARACTERISTICS", now U.S. Pat. No. 8,502,557, issued Aug. 6, 2013, which claims the benefit of Provisional Application No. 60/811,164, filed Jun. 5, 2006 titled "METHODS FOR FORMING ELECTRICAL NETWORKS THAT APPROXIMATE DESIRED PERFORMANCE CHARACTERISTICS", the disclosures of each of which are hereby incorporated by reference in their entireties herein.

BACKGROUND OF THE INVENTION

1. Field of the Invention

The present invention relates to forming of electrical networks that produce an approximation of desired performance characteristics.

2. Description of the Related Art

Many electronic systems suffer from performance degradation due to variations between components. Often a trim is employed to minimize the impact of component variations and thereby enhance circuit performance. This has traditionally been accomplished by adding specialized circuitry with selectively variable performance or by providing present components with a means to vary their value.

This approach has come with a number of drawbacks. The most general difficulty is that the trim does not reduce the variations but adds more circuitry to try to counter-balance the existing variations. Inevitably, the operating mechanism of the variations and the trim are different and do not balance under all operating conditions and circumstances. Often, the trim circuitry's variations also introduce their own performance degradations.

BRIEF SUMMARY OF THE INVENTION

The present invention is directed to minimizing undesired variations in the performance of electronic networks that would ideally have either no variation or a controlled amount of variation. The invention proposes that selective combinations of sub-networks of like kind and like measure can be used to form electronic circuits with arbitrarily small deviation from a set of desired performance characteristics.

The novel features of the invention are set forth with particularity in the appended claims. The invention will be best understood from the following description when read in conjunction with the accompanying drawings.

DETAILED DESCRIPTION OF THE INVENTION

The following description is directed to the minimization of undesired variations in the performance of electronic networks that would ideally have either no variation or a controlled amount of variation. Embodiments of the invention illustrate the recognition that selective combinations of sub-networks of like kind and like measure can be used to form electronic networks in such a way that a circuit containing these networks will have a small variation from some set of desired performance characteristics.

Figure 1:
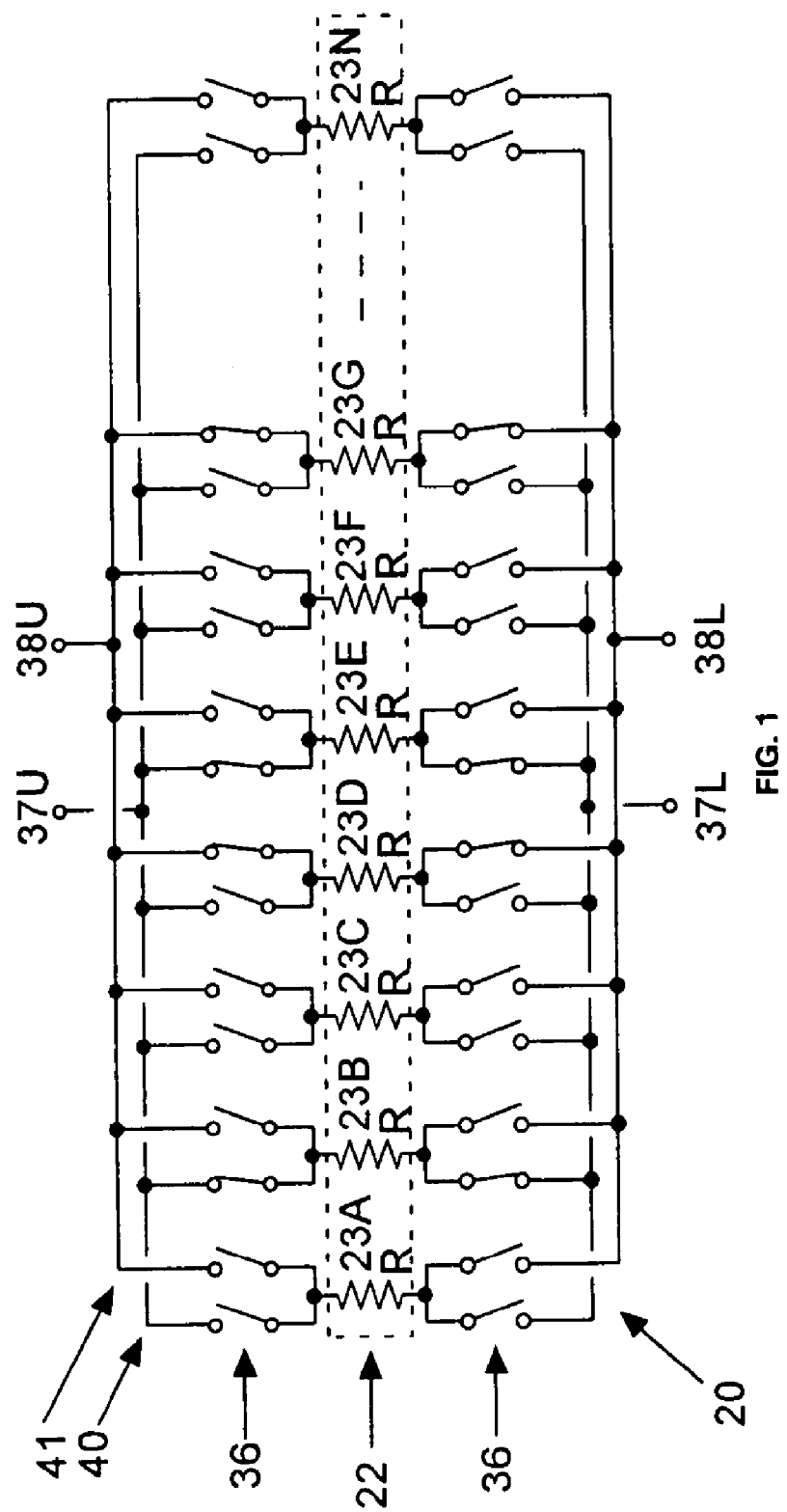
FIGS. 1 and 2 are schematic diagrams of embodiments of the present invention.

FIG. 1 illustrates an embodiment 20 of the invention for forming electrical networks that produce an approximation of a set of desired performance characteristics. Typically, pre-determined topologies are chosen to implement the networks. Exemplary pre-determined network topologies for networks 40 and 41 would be two resistors in parallel. An exemplary set of desired performance characteristics is that two networks be formed that match resistance values to within a certain tolerance, and match voltage coefficients of resistance to within a certain tolerance. There are many other possible performance characteristics whose specifications depend on the desired outcome.

In embodiment 20, a pool 22 of sub-networks 23A-23N is provided wherein the sub-networks are of like kind, in this case resistors, and of like measure, each having a nominal resistance R. The pool 22 forms a supply from which sub-networks can be combined to form two-terminal networks 40 and 41. This combining can be done in numerous ways while maintaining the pre-determined network topology. For example, network 40 can be created by any parallel combination of two resistors from the pool of resistors 22. Likewise network 41 can be created by any parallel combination of two resistors from the pool 22. The only constraint would be that networks 40 and 41 do not both use the same resistor.

A determination is then made of the performance of each combination with respect to the desired performance characteristics. An exemplary determination could be made by measuring the performance of each combination directly. More often however, it will be necessary to measure only a few of the combinations. The performance of the other combinations are then determined via calculation. This is particularly true when the combinations combine following the principles of linearity.

Combinations of the sub-networks are then selectively connected to form particular combinations of the sub-networks to implement the electrical networks. For example, the embodiment 20 of FIG. 1 includes a set 36 of switches which provide an exemplary means for selectively connecting the sub-networks. Four of the switches have been moved to positions that connect sub-networks 23B and 23E between upper and lower terminals 37U and 37L, and that connect sub-networks 23D and 23G between upper and lower terminals 38U and 38L. Sub-networks 23B and 23E and sub-networks 23D and 23G have thereby been selectively connected in a particular combination to implement networks 40 and 41 which produce an approximation of a desired set of performance specifications. The selected combinations are normally connected in the factory, but this could also be done by the user, or the system could periodically self-test itself and establish appropriate connections, such as at turnon.

The embodiment of FIG. 1 is based on the invention's recognition that fabrication variations will typically introduce slight variations in electronic sub-networks which are intended to be nominally equivalent. In an important feature of the invention, these fabrication variations are turned to an advantage by providing a pool of like kind and like measure sub-networks and then selectively connecting particular combinations of these sub-networks to implement networks that approximate the desired performance characteristics. With a sufficiently large pool of these sub-networks, it has been found that the selection can be done such that the sub-network variations more or less cancel each other, or combine with a desirable bias in cases where balance is not the goal. When the variations are random, and there are a sufficiently large number of combinations available, it is often probable that at least one of the combinations results in networks which satisfy the performance specifications. This allows the practitioner to obtain arbitrarily small deviations from the desired performance characteristic as the number of devices in the pool increases, with no need to fabricate trim devices.

There are many possible ways to form networks from the pools of sub-networks. In some cases, the two or more networks may be formed from a common pool. This is the case in the exemplary embodiment of FIG. 1 when both networks 40 and 41 can utilize the sub-networks 23A-23N, from pool 22, without restriction.

Figure 2:
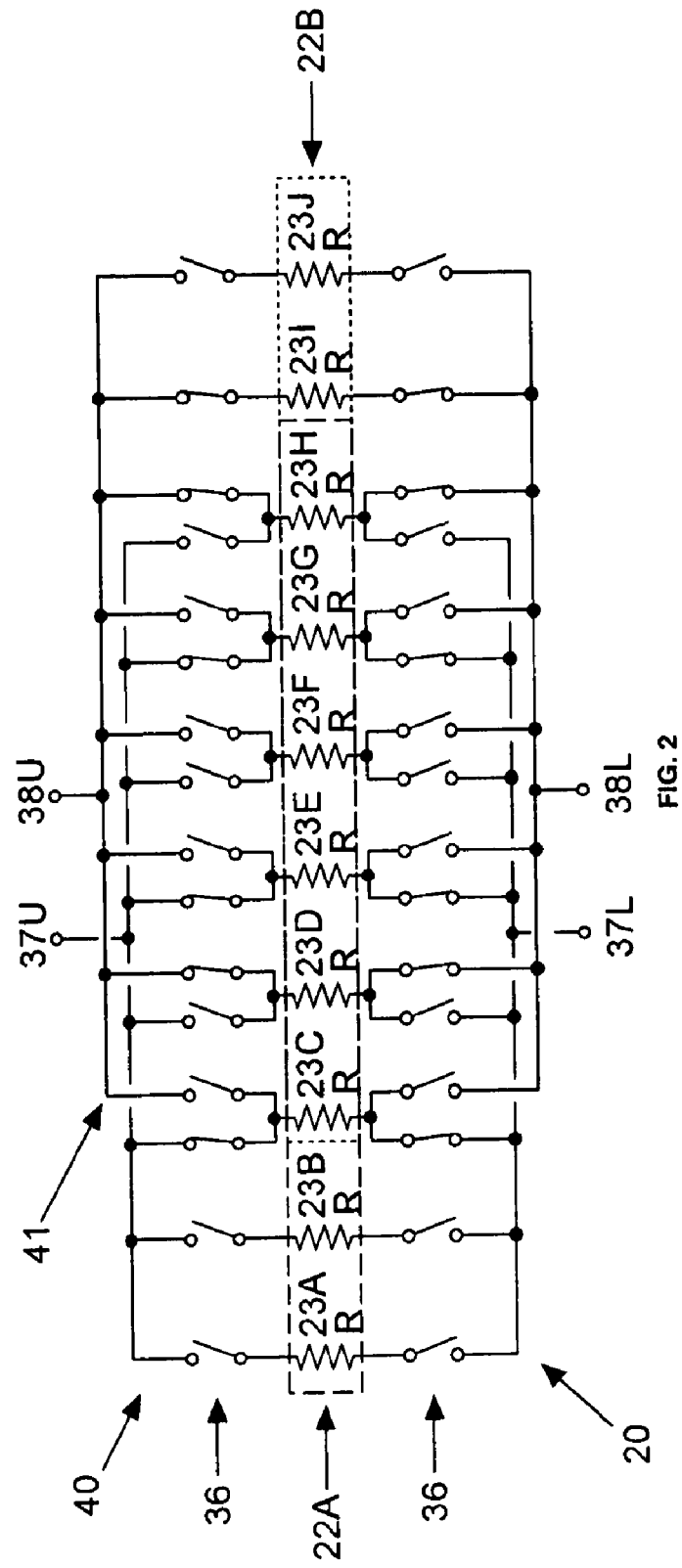

Exemplary embodiment 20 of FIG. 2, which includes elements from embodiment 20 of FIG. 1 with like elements indicated by like reference numbers, illustrates the situation where the networks are formed from overlapping pools of sub-networks. Network 40a is formed from a pool 22A consisting of sub-networks 23A-23H. Network 41 is formed from a pool 22B consisting of sub-networks 23C-23J. FIG. 2 shows a combination such that network 40 is formed from the parallel combination of sub-networks 23C, 23E and 23G. Network 41 is formed from the parallel combination of sub-networks 23D, 23H and 23I. It is clear from the illustration that it is not possible to include sub-networks 23A and 23B in network 41a. Similarly, it is not possible to include sub-networks 23I and 23J in network 40. Additionally, it should be noted that the combinations were not constrained to use at least one of 23A or 23B. Note also that the combinations were not constrained to include at least one of 23I or 23J either. Sub-networks 23C-23H comprise the overlapping portion of the two pools.

Figure 3:
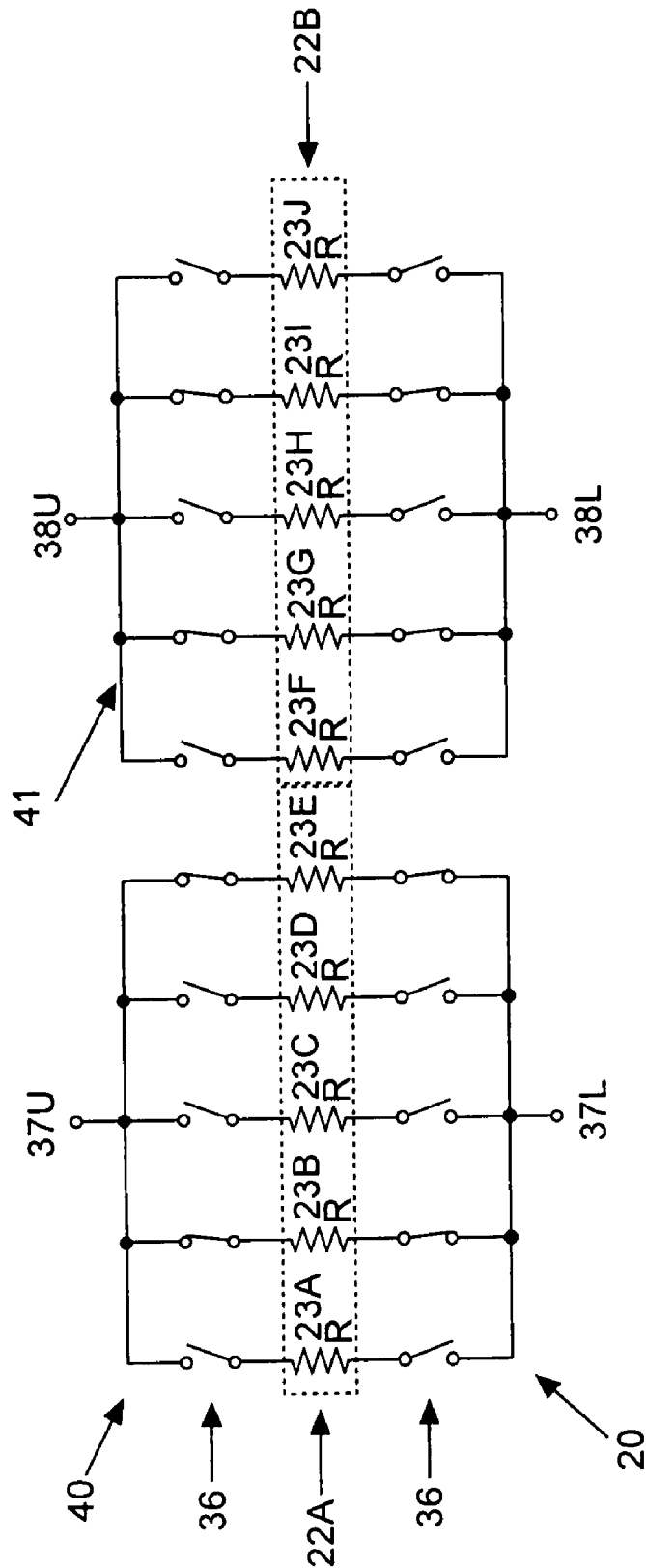
FIG. 3 is a schematic diagram of an embodiment in which networks are formed from disjoint pools of devices.

Networks may also be formed from disjoint pools of devices. Exemplary embodiment 20 of FIG. 3 illustrates the formation of networks from disjoint pools of devices. In this diagram, elements of embodiment 20 of FIG. 1 are included with like elements indicated by like reference numbers. Embodiment 20 of FIG. 2 includes pool 22A comprised of sub-networks 23A-23E and pool 22B comprised of sub-networks 22F-22J. Network 40 is formed from the pool 22A and network 41 is formed from pool 22B. These pools have no sub-networks in common. It is possible that the selection of a combination to form network 40 may depend on the combination selected for network 41. So while the pools may be disjoint the determination and selection may be done jointly. In FIG. 3, it would not be incorrect to hold the perspective that this case really involves the application of the inventive method to the formation of two networks. However, in general, the case of disjoint pools (pools having no elements in common) makes it clear that the determination and selection of the combinations may be done jointly even when the pools are disjoint.

Figure 4:
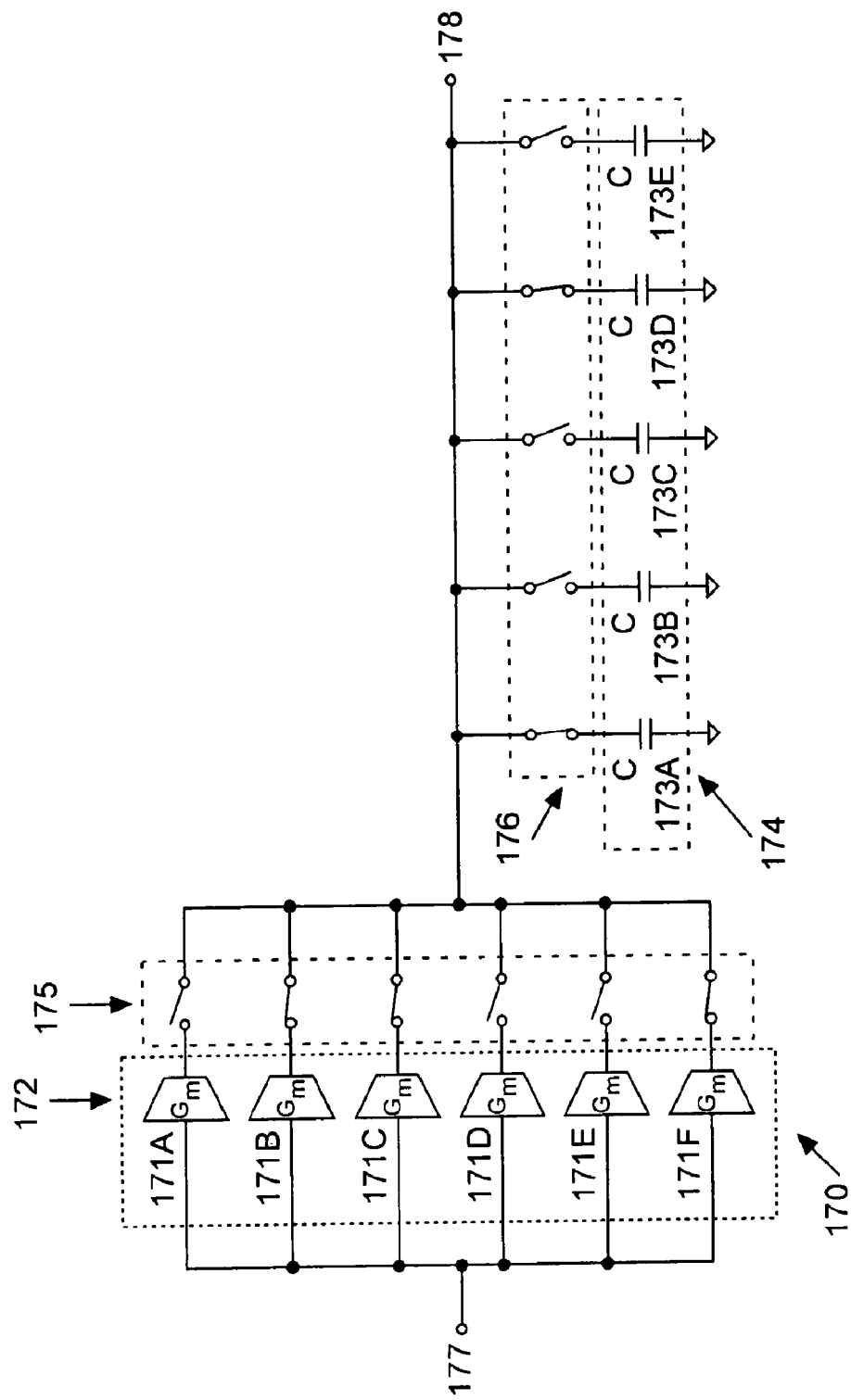
FIG. 4 is a schematic diagram that illustrates an embodiment in which networks are formed from disjoint pools of different kinds of sub-networks.

The exemplary method embodiment of FIG. 4 illustrates an application of the invention using two disjoint pools in which the pools are of different kind. Pool 172 comprises sub-networks 171A-171F of like kind, transconductors, and like measure. Pool 174 comprises sub-networks 173A-173E of like kind, capacitors, and like measure. The illustration illustrates an exemplary selection of three parallel transconductors and two parallel capacitors. Such a topology is useful for creating what is known as a Gm-C filter. Often, it is desirable to achieve a specific pole frequency while not distorting the signal. Both performance characteristics depend upon the behavior of the transconductors. Typically, better linearity is achieved for a lower transconductance. At the same time, a higher pole frequency is obtained for a larger transconductance. The pole frequency also depends inversely upon the total capacitance. The invention can be used to find the combination of transconductance and capacitance that minimizes transconductance, so as to maximize linearity, subject to the constraint that the circuit achieves the desired pole frequency within some tolerance. This exemplary embodiment demonstrates that the determination and selection of the combinations can be done jointly when the pools are disjoint, even when the disjoint pools are of different kind.

Figure 5:
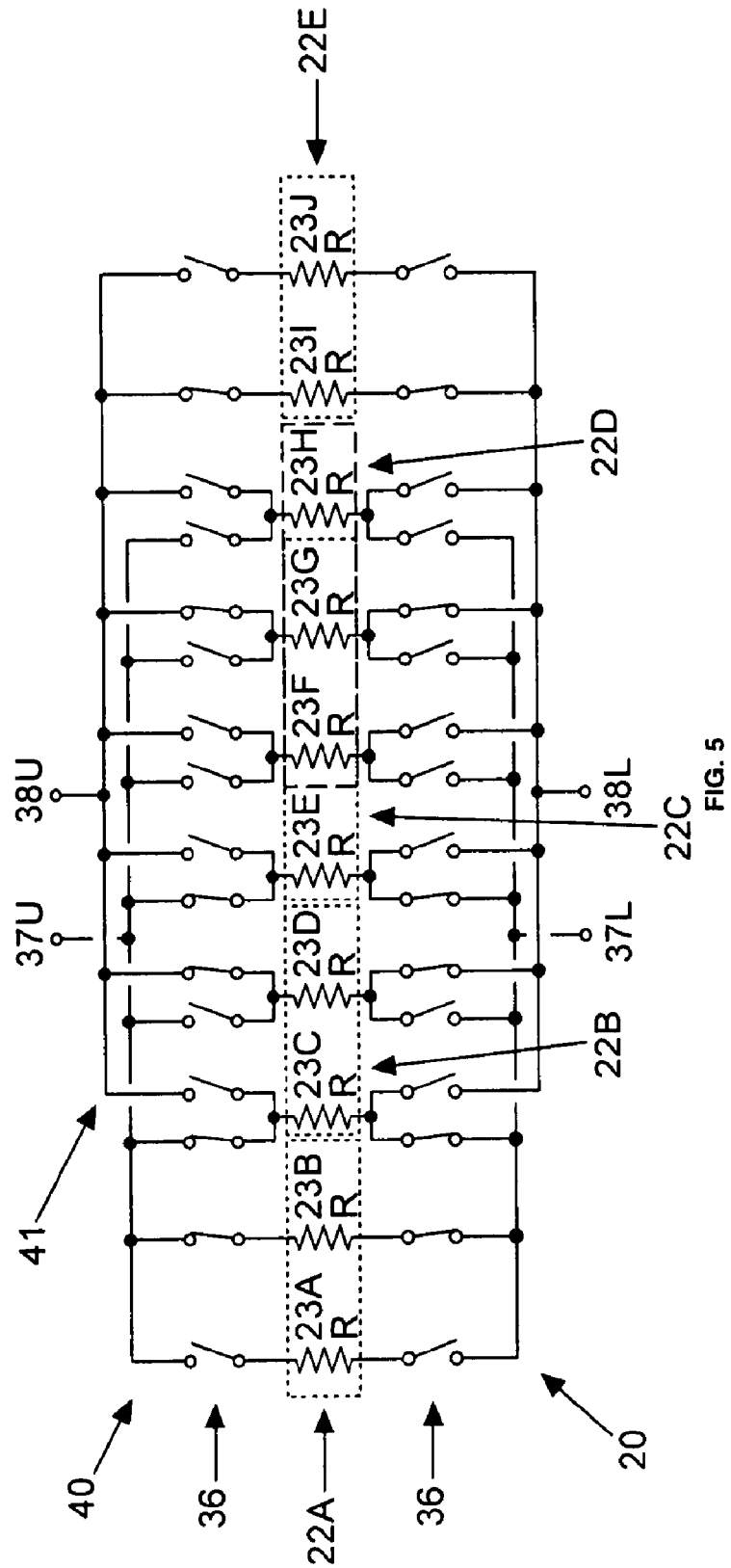
FIG. 5 is a schematic of an embodiment in which networks are formed from a combination of different types of device pools.

Networks may also be formed from a mixture of common, overlapping and/or disjoint pools. Embodiment 20 of FIG. 5, which includes elements of embodiment 20 of FIG. 1 with like elements indicated by like reference numbers, illustrates a mixture of types of pools. Pool 22A, which is disjoint with respect to the other pools, comprises sub-networks 23A and 23B. Pool 22B, which is a common pool, comprises sub-networks 23C and 23D. Pool 22C comprises sub-networks 23E, 23F and 23G. Pool 22D comprises sub-networks 23F, 23G and 23H. Pools 22C and 22D are overlapping; namely sub-networks 23F and 23G overlap. Pool 22E, which is a joint pool, comprises sub-networks 23I and 23J. Network 40, as shown in the illustration, comprises one sub-network from disjoint pool 22A, one network from common pool 22B, and one sub-network from overlapping pool 22C. Network 41, as shown, comprises one sub-network from disjoint pool 22E, one sub-network from common pool 22B, and one sub-network from overlapping pool 22D. It should be understood that many other possible arrangements of sub-networks is possible using the combination of common, overlapping and disjoint pools.

Figure 6:
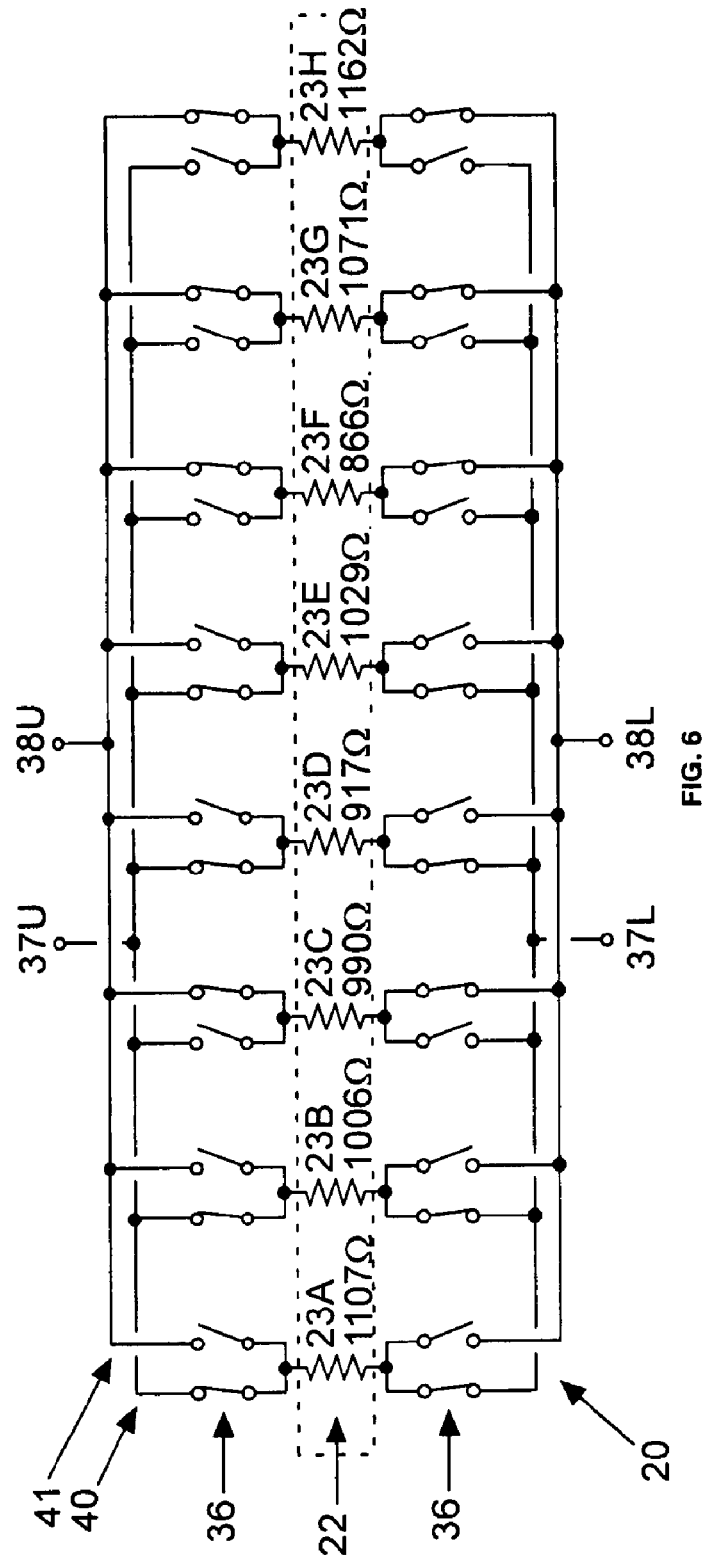
FIG. 6 is a schematic of an embodiment in which the nominal resistor values of FIG. 1 are replaced with exemplary values which may result from actual fabrication.

FIG. 6 illustrates another exemplary embodiment 20 which includes elements of the embodiment 20 of FIG. 1 with like elements indicated by like reference numbers. In this example, the nominal resistor values of FIG. 1 are replaced with exemplary values which may result from actual fabrication. The resistors are nominally 1 kΩ resistors, but they have a random variation around the nominal value. In this example the random variation is a normal distribution with a standard deviation of 200Ω (20% of the nominal value). In this example, four resistor sub-networks are to be connected in parallel to form network 40 between terminals 37U and 37L. Likewise, four resistor sub-networks are to be connected in parallel to form network 41 between terminals 38U and 38L. The bank of switches 36 is provided to selectively connect the resistors. Table 1 lists the possible combinations of resistors that can be utilized to form networks 40 and 41. For this example, a performance characteristic of interest would be the matching of the two resistors, expressed in a percentage relative to their average. Determination of the performance of the combinations reveals that combination number 6 provides matching of 0.02% (the performance of the all the combinations is listed in Table 2). According to the method, this combination is then selected, as is represented by the switch settings in FIG. 6. It should be noted that it is not required to choose the combination that most nearly satisfies the performance criteria. In some applications of the invention, there may be situations where this is not done.

With combination number 6 it can be seen that network 40 is formed from the parallel combination of 1107Ω, 1006Ω, 917Ω and 1029Ω resistors. Network 41 is formed from the parallel combination of 990Ω, 866Ω, 1071Ω and 1162Ω resistors. The average resistor value, taken over all the resistors, is 1018.5Ω. Thus it can be seen that for network 40, the excess of 1107Ω resistor above the mean resistance is roughly balanced by the deficit of the 917Ω resistor. Likewise, the excess of the 1029☐ resistor roughly balances the deficit of the 1006Ω resistor. Similarly, the excess of the 1162Ω resistor is balanced by the deficit of the 866Ω resistor. The excess of the 1071Ω resistor balances the deficit of the 990Ω resistor. It is the combination's total performance that was used as the selection criteria, but it is helpful to understanding the method to see how in some cases the random variations roughly balance.

The embodiment 20 of FIG. 6 can be used as a mathematical example of how in many systems small sub-network variations combine linearly. Given four resistors, $R_1$, $R_2$, $R_3$ and $R_4$, of nominally equal value R, the parallel combination yields a resistor value of:

$$R_0 = \frac{R_1 R_2 R_3 R_4}{R_1 R_2 R_3 + R_1 R_3 R_4 + R_1 R_2 R_4 + R_2 R_3 R_4}.$$

The variation in the resistance of the parallel combination is caused by the random variations $\Delta R_1$, $\Delta R_2$, $\Delta R_3$ and $\Delta R_4$ in resistors $R_1$, $R_2$, $R_3$ and $R_4$, respectively. A first order approximation of the variation is readily found using calculus:

$$R_0 \cong \frac{R}{4} + \frac{1}{16}(\Delta R_1 + \Delta R_2 + \Delta R_3 + \Delta R_4).$$

Clearly, to a first order approximation, the random variations are combining linearly. This is true even though the parallel resistance depends in a non-linear fashion on the resistor values. The implication is that for random variations that result from a zero-mean process, for a large enough number of sub-networks, it should be possible to select a combination in which the sub-network variations cancel to a first order approximation. This principle is valid for many of the systems that are the subject of the method. As mentioned previously, the linearity of the variations allows for the performance of only a few combinations to be tested to deduce the sub-network variations, while the performances of the rest of the combinations are calculated.

TABLE 1

Exemplary Combinations forming Networks 40 and 41.

| Combination Number | Resistor Comprises Which Network | | | | | | | |
|---|---|---|---|---|---|---|---|---|
| | 23A 1107 Ω | 23B 1006 Ω | 23C 990 Ω | 23D 917 Ω | 23E 1029 Ω | 23F 866 Ω | 23G 1071 Ω | 23H 1162 Ω |
| 1 | 40 | 40 | 40 | 40 | 41 | 41 | 41 | 41 |
| 2 | 40 | 40 | 40 | 41 | 40 | 41 | 41 | 41 |
| 3 | 40 | 40 | 40 | 41 | 41 | 40 | 41 | 41 |
| 4 | 40 | 40 | 40 | 41 | 41 | 41 | 40 | 41 |
| 5 | 40 | 40 | 40 | 41 | 41 | 41 | 41 | 40 |
| 6 | 40 | 40 | 41 | 40 | 40 | 41 | 41 | 41 |
| 7 | 40 | 40 | 41 | 40 | 41 | 40 | 41 | 41 |
| 8 | 40 | 40 | 41 | 40 | 41 | 41 | 40 | 41 |
| 9 | 40 | 40 | 41 | 40 | 41 | 41 | 41 | 40 |
| 10 | 40 | 40 | 41 | 41 | 40 | 40 | 41 | 41 |
| 11 | 40 | 40 | 41 | 41 | 40 | 41 | 40 | 41 |
| 12 | 40 | 40 | 41 | 41 | 40 | 41 | 41 | 40 |
| 13 | 40 | 40 | 41 | 41 | 41 | 40 | 40 | 41 |
| 14 | 40 | 40 | 41 | 41 | 41 | 40 | 41 | 40 |
| 15 | 40 | 40 | 41 | 41 | 41 | 41 | 40 | 40 |
| 16 | 40 | 41 | 40 | 40 | 40 | 41 | 41 | 41 |
| 17 | 40 | 41 | 40 | 40 | 41 | 40 | 41 | 41 |
| 18 | 40 | 41 | 40 | 40 | 41 | 41 | 40 | 41 |
| 19 | 40 | 41 | 40 | 40 | 41 | 41 | 41 | 40 |
| 20 | 40 | 41 | 40 | 41 | 40 | 40 | 41 | 41 |
| 21 | 40 | 41 | 40 | 41 | 40 | 41 | 40 | 41 |
| 22 | 40 | 41 | 40 | 41 | 40 | 41 | 41 | 40 |
| 23 | 40 | 41 | 40 | 41 | 41 | 40 | 40 | 41 |
| 24 | 40 | 41 | 40 | 41 | 41 | 40 | 41 | 40 |
| 25 | 40 | 41 | 40 | 41 | 41 | 41 | 40 | 40 |
| 26 | 40 | 41 | 41 | 40 | 40 | 40 | 41 | 41 |
| 27 | 40 | 41 | 41 | 40 | 40 | 41 | 40 | 41 |
| 28 | 40 | 41 | 41 | 40 | 40 | 41 | 41 | 40 |
| 29 | 40 | 41 | 41 | 40 | 41 | 40 | 40 | 41 |
| 30 | 40 | 41 | 41 | 40 | 41 | 40 | 41 | 40 |
| 31 | 40 | 41 | 41 | 40 | 41 | 41 | 40 | 40 |
| 32 | 40 | 41 | 41 | 41 | 40 | 40 | 40 | 41 |
| 33 | 40 | 41 | 41 | 41 | 40 | 40 | 41 | 40 |
| 34 | 40 | 41 | 41 | 41 | 40 | 41 | 40 | 40 |
| 35 | 40 | 41 | 41 | 41 | 41 | 40 | 40 | 40 |

TABLE 2

Performance of Exemplary Combinations.

| Combination Number | Network 40 Resistance (Ω) | Network 41 Resistance (Ω) | Absolute Resistance Error (Ω) | Relative Resistance Error (%) |
|---|---|---|---|---|
| 1 | 250.13 | 255.05 | 4.92 | 1.95 |
| 2 | 257.78 | 247.55 | 10.23 | 4.05 |
| 3 | 246.17 | 259.29 | 13.12 | 5.19 |
| 4 | 260.34 | 245.24 | 15.10 | 5.97 |
| 5 | 265.39 | 240.92 | 24.47 | 9.67 |
| 6 | 252.54 | 252.58 | 0.04 | 0.02 |
| 7 | 241.39 | 264.82 | 23.43 | 9.26 |
| 8 | 255.00 | 250.17 | 4.83 | 1.91 |
| 9 | 259.84 | 245.68 | 14.16 | 5.60 |
| 10 | 248.51 | 256.75 | 8.24 | 3.26 |
| 11 | 262.96 | 242.96 | 20.00 | 7.91 |
| 12 | 268.11 | 238.72 | 29.39 | 11.60 |
| 13 | 250.89 | 254.26 | 3.37 | 1.33 |
| 14 | 255.58 | 249.62 | 5.96 | 2.36 |
| 15 | 270.88 | 236.57 | 34.31 | 13.52 |
| 16 | 251.52 | 253.61 | 2.09 | 0.83 |
| 17 | 240.46 | 265.95 | 25.49 | 10.07 |
| 18 | 253.96 | 251.18 | 2.78 | 1.10 |
| 19 | 258.76 | 246.65 | 12.11 | 4.79 |
| 20 | 247.53 | 257.81 | 10.28 | 4.07 |
| 21 | 261.85 | 243.91 | 17.94 | 7.09 |
| 22 | 266.96 | 239.64 | 27.32 | 10.79 |
| 23 | 249.88 | 255.30 | 5.42 | 2.15 |
| 24 | 254.53 | 250.62 | 3.91 | 1.55 |
| 25 | 269.71 | 237.47 | 32.24 | 12.71 |
| 26 | 242.69 | 263.27 | 20.58 | 8.14 |
| 27 | 256.45 | 248.79 | 7.66 | 3.03 |
| 28 | 261.35 | 244.34 | 17.01 | 6.73 |
| 29 | 244.96 | 260.65 | 15.69 | 6.21 |
| 30 | 249.43 | 255.78 | 6.35 | 2.51 |
| 31 | 263.98 | 242.09 | 21.89 | 8.65 |
| 32 | 252.30 | 252.83 | 0.53 | 0.21 |
| 33 | 257.04 | 248.24 | 8.80 | 3.48 |
| 34 | 272.52 | 235.33 | 37.19 | 14.65 |
| 35 | 259.58 | 245.91 | 13.67 | 5.41 |

To further enhance an understanding of these embodiments of the invention, it is useful to momentarily divert attention to conventional methods for providing two resistors that approximate a desired resistance. In these conventional approaches, primary resistors have typically been configured so that their resistances are as close as possible to the desired resistance. It has been found, however, that fabrication variations produce primary resistors whose resistances can unacceptably vary from the desired resistance. Generally, this problem has been addressed by fabricating additional trim resistors that have resistances significantly less than the primary resistors. One or more trim resistors are then coupled with one or more of the primary resistors in attempts to obtain an acceptable variation from the desired resistance. Another method of trimming resistors involves the removal of physical material from the initially fabricated resistors.

The present invention recognizes, however, that the conventional approaches have several problems which include:
a) trimming generally does not move the circuit toward a more ideal behavior but adds more circuitry in attempts to counter-balance the existing non-ideality,
b) the operating mechanism of the non-idealities and the trim can be different and fail to balance under all operating conditions and circumstances,
c) the trim circuitry's non-ideal behavior often introduces its own performance degradation,
d) the trim can be performed relative to only one performance specification,
e) the trim method must be incorporated into the design of the product, and
f) in some cases, the trim is irreversible.

In contrast, the embodiment 20 shown in FIG. 1 does not fabricate resistors whose resistances are intended to have the desired resistance. Rather, it fabricates resistors whose resistances are intended be of like kind and like measure, and selectively connects combinations of these resistors. Thus, resistors may be fabricated to have resistances N times that of the desired resistance, and particular combinations of N resistors are selectively connected. For example, if N is 2, resistors are fabricated to have resistances twice that of the desired resistance and particular combinations of 2 resistors are selectively connected in parallel. If N is 3, resistors are fabricated to have resistances three times that of the desired resistance and particular combinations of 3 resistors are selectively connected in parallel. In the selection method of FIG. 1 and where N is 2, resistors would be fabricated to have resistances twice that of the desired resistance and particular combinations of 2 resistors are selectively connected in parallel. In this way, the selective combination of resistors of like measure yields a network with an enhanced approximation of the desired value.

At this point a digression is necessary to explore the scope of what the set of performance characteristics might comprise. The set may have one or more performance characteristics. An element of the set of desired performance characteristics is typically a target value or range of values of a measurable quantity. The measurements are made on the networks themselves, or on larger systems which contain the networks. The characteristics may pertain to the performance of a network in isolation, or the performance of two or more networks relative to each other.

In some embodiments of the invention, there may be only one performance characteristic in the set of desired performance characteristics. In other examples, there may be multiple performance characteristics, some of which trade-off with each other. In the embodiment 20 of FIG. 1, an exemplary set of performance characteristics with only one member is that the networks 40 and 41 match resistance value to within ±1%. It is important to observe that this is only one among many possible sets of performance characteristics that can be associated with networks 40 and 41. Another possible set of performance characteristics is that the networks 40 and 41 match resistance value to within ±2% and match voltage coefficients to within 50 ppm/V. Generally stated, there are many possible sets of performance characteristics that can be associated with networks formed using this invention. This has practical value in that the method can be used to different ends given the same physical sub-networks. In integrated circuits, this makes it possible to fabricate sub-networks and then apply the method differently based on the desired outcome. With typical prior-art trimming methods, the trimming structures are chosen before integration in such a way as to achieve certain specifications and there is little flexibility once the devices are fabricated. Another advantage of the current invention over most prior trimming methods is that it allows for the simultaneous actualization of several performance characteristics. Most other trimming methods require additional circuitry to realize each adjustment for the multiple performance characteristics.

The elements of the set of desired performance characteristics are typically target values for measurable electrical quantities. Electrical performance characteristics may involve quantities of resistance, capacitance, inductance, threshold voltage, transconductance, voltage drop, voltage, current, frequency response, oscillation frequency and time delay. They may also involve resistance matching, capacitance matching, inductance matching, offset voltage, transconductance matching, voltage-drop matching, current matching, frequency response matching, oscillation frequency matching, and time delay matching. Performance characteristics may also be targets for measurements of mechanical, thermodynamic, optical, acoustical or other quantities. If a target is a limit, there is generally a finite probability that the method is not able to meet the target. The limits should normally be chosen so that it is probable the target is met. If the desired characteristic is a target value, the method is used to come close to the target value.

Figure 7:
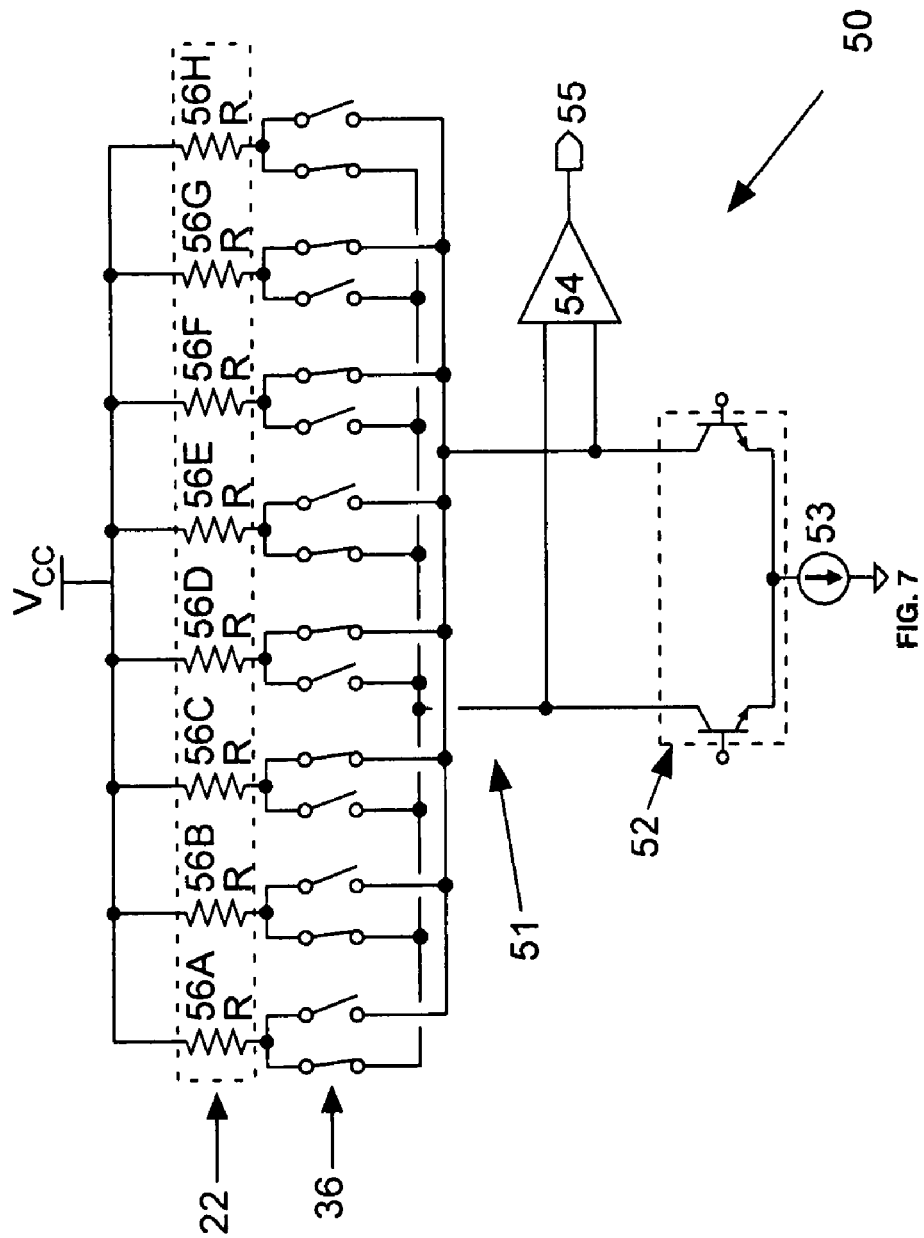
FIG. 7 is a schematic of an embodiment in which performance characteristics depend upon a multi-stage amplifier separate from the network being formed.

According to the invention, performance characteristics may depend on circuitry other than the network or networks being formed. Typically this will occur when a network is part of a larger circuit. FIG. 7, for example, illustrates a performance characteristic in association with a system in the form of a multi-stage amplifier 50. This figure illustrates an initial stage 51 that is formed with a differential pair 52 of transistors, a current source 53, and collector loads which are networks formed according to the invention. One load is composed of resistors 56A, 56B, 56E and 56H. The other is composed of resistors 56C, 56D, 56F and 56G. The differential pair is arranged to steer the current of the current source across the collector loads in response to a differential input signal across the bases of the transistors. Subsequent amplifier stages are summarized as a generic amplifier stage 54 which generates an output signal at an output port 55 in response to a differential signal across the collector loads.

When there is no differential signal applied across the bases of the differential pair 52, it is desired that the voltage at the output port 55, termed the offset voltage, be as close to zero as possible. This would be the exemplary performance characteristic. These combinations of resistors would have been selected because they produce an approximation of the desired zero offset voltage. In this embodiment, therefore, the combinations have been selectively connected which produce the minimum offset voltage at the output port 55 as the performance characteristic to be approximated.

The performance characteristic may be dependent on one, two or more networks formed according to the invention. That is, sometimes the performance characteristic will depend upon the relationship between two or more networks. This will often be the case when circuits require matching components.

Figure 8:
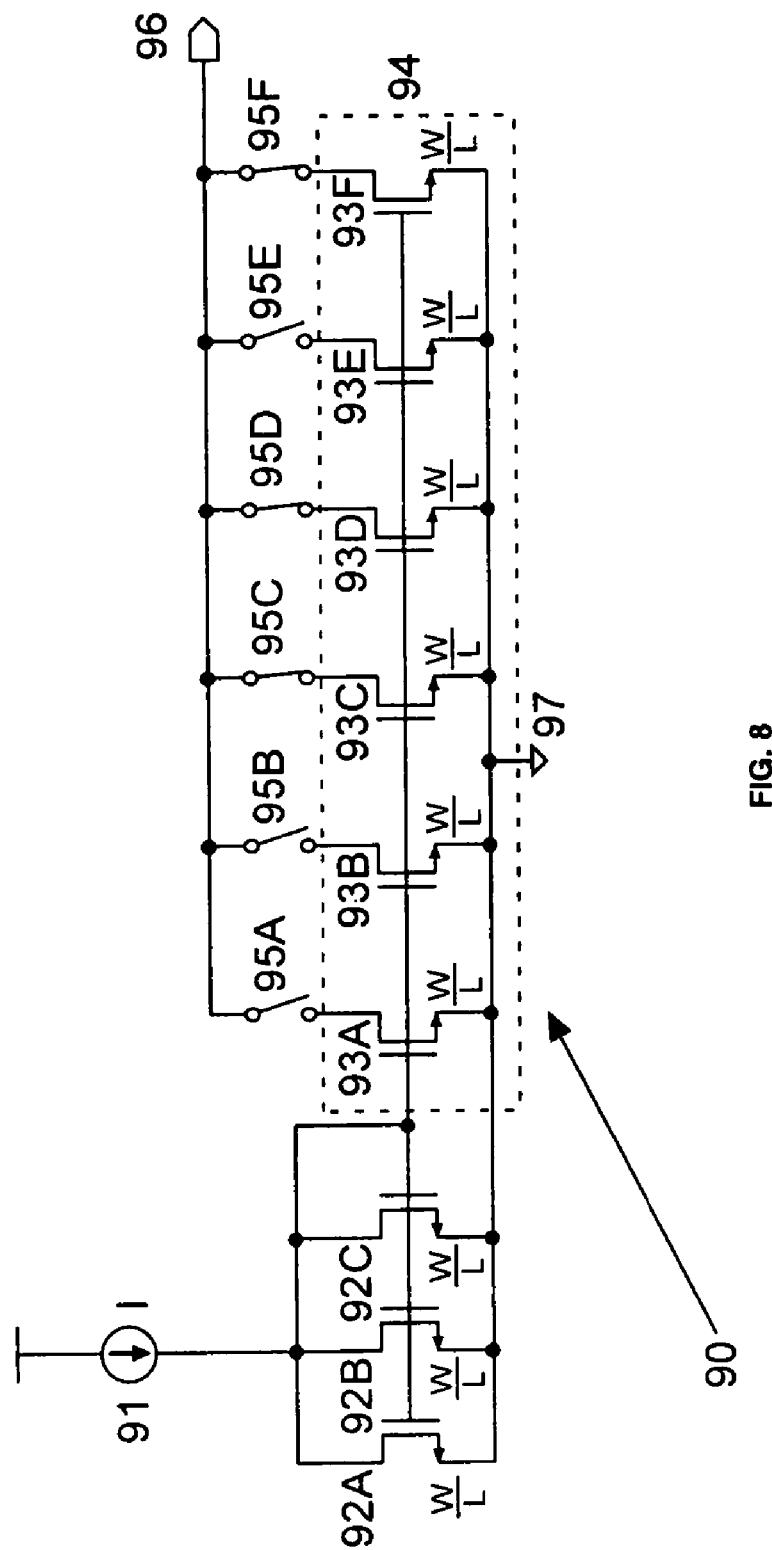
FIG. 8 is a schematic of an embodiment in which performance characteristics depend upon a circuitry separate from the network being formed.

Performance characteristics may be relative to circuitry not formed according to the invention as well. FIG. 8 illustrates an exemplary embodiment of a current mirror 90 in which the performance characteristic of the network is relative to circuitry not formed according to the invention. Current mirror 90 includes a current source 91, with current I, which connects to diode-connected transistors 92A-92C, all of the same width W and length L. The gates of transistors 92A-92C are connected to the gates of the transistors 93A-93F. Transistors 93A-93F form a pool 94 of devices of like kind and like measure. The sources of transistors 92A-92C and 93A-93F are connected to a common terminal 97. The drains of transistors 93A-93F are connected to first terminals of the selection switches 95A-95F respectively. The second terminals of the selection switches are connected to output terminal 95. One exemplary performance criteria would be that the output current equals the current source current, I, as nearly as possible. The transistors from the pool 94 can be combined in a network topology of three parallel transistors using the selection switches 95A-95F. After a determination is made of the best performing combination, selections switches 95A-95F would be set accordingly. FIG. 8 illustrates the possible outcome in which switches 94C, 94D and 94F are closed, thereby selecting transistors 93C, 93D and 93F to form the network. This example demonstrates that a network formed according to the invention can be based on performance criteria relative to other circuitry, in this case transistors 92A-92C.

Figure 9:
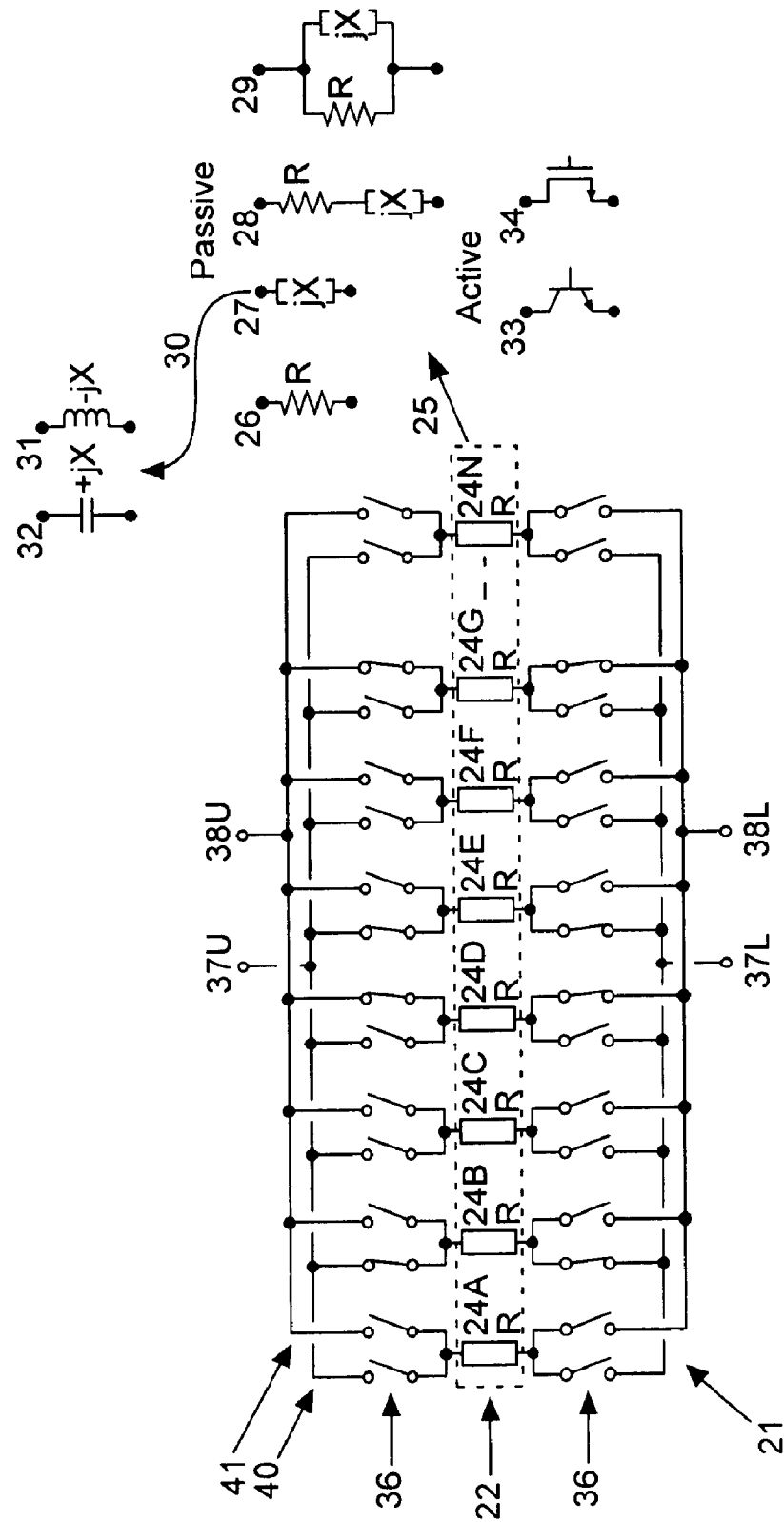
FIG. 9 is a schematic of an embodiment in which the resistors of FIG. 1 are replaced with another kind of sub-network.

FIG. 9 illustrates method embodiment 21 which includes elements of the embodiment 20 of FIG. 1 with like elements indicated by like reference numbers. In embodiment 21, the resistors 23A-23N of FIG. 1 are replaced with sub-networks 24A-24N. As indicated by arrow 25 that leads away from the pool 22, exemplary sub-networks of like kind include passive devices such as resistors 26 (that have resistance R), reactive elements 27 (that have reactance jX), series arrangements 28 of resistors and reactive elements, and parallel arrangements 29 of resistors and reactive elements. Arrow 30 indicates that the reactive elements may be inductive (i.e., inductors 31) or capacitive (i.e., capacitors 32). Exemplary sub-networks of like kind also include active devices such as transistors which may, for example, be bipolar junction transistors 33 or metal-oxide-semiconductor transistors 34. More complex examples of sub-networks of like kind can easily be constructed through series and parallel connections of active and passive devices.

According to each type of sub-network of different kind, there also corresponds a notion of like measure; the sub-networks should be quantitatively similar. For the resistor 26, an example of like measure is resistance. In integrated circuits, resistors are often fabricated as a resistive film so that other examples of like measure are resistor width and resistor length. Yet, in some cases in integrated circuits, the width and length may not affect performance and the measure of interest would simply be resistance.

For the reactive element 27, an example of like measure is reactance which may include positive and negative reactance values. For series arrangements 28 of resistors and reactive elements, an example of like measure is impedance at a specific frequency. Another example of like measure would be impedances at two different frequencies. Another example of like measure would be series resistance and series reactance. In the case where the reactance element is an inductor, the measure would be series resistance and series inductance. For parallel arrangements 29, an example of like measure is impedance at a specific frequency. Another example would be parallel resistance and parallel reactance. For the active devices, an example of like measure is transconductance. For the MOSFET 35, an example of measure would be transistor width and length. Accordingly, the measure examples introduced above and additional examples are listed in Table 3 alongside their respective sub-network kinds. This table of kinds and measures is not exhaustive of the possibilities, but merely exemplary.

TABLE 3

Exemplary Kinds and Measures

| Kind | Measure |
| --- | --- |
| Resistor | Resistance |
|  | Resistor area |
|  | Resistor width |
|  | Resistor length |
| Capacitor | Capacitance |
|  | Capacitor area |
|  | Capacitor perimeter |
|  | Parasitic resistance |
|  | Stray capacitance |
| Inductor | Inductance |
|  | Wire length |
|  | Loop area |
|  | Parasitic resistance |
|  | Leakage inductance |
| Diode | Junction Area |
|  | Capacitance |
| Bipolar transistor | Emitter Area |
|  | Emitter perimeter |
|  | Saturation current |
|  | Base capacitance |
|  | Base resistance |
|  | Base capacitance |
|  | Early voltage |
|  | Transconductance |
| MOS transistor | Threshold voltage |
|  | Gate width |
|  | Gate Length |
|  | Gate capacitance |
|  | Transconductance |
| Series Resistor and Inductor | Series Resistance |
|  | Series Inductance |
|  | Impedance |
|  | Admittance |
| Series Resistor and Capacitor | Series Resistance |
|  | Series Capacitance |
|  | Impedance |
|  | Admittance |
| Parallel Resistor and Inductor | Parallel Resistance |
|  | Parallel Inductance |
|  | Impedance |
|  | Admittance |
| Parallel Resistor and Capacitor | Parallel Resistance |
|  | Parallel Capacitance |
|  | Impedance |
|  | Admittance |

Combinations of sub-networks of like kind can be formed in many possible ways. Exemplary embodiment 20 of FIG. 1 shows parallel combinations of resistors, sub-networks of like kind. As previously mentioned, network can be created by any parallel combination of two resistors from the pool of resistors 22. Likewise, network 41 can be created by any parallel combination of two resistors from the pool 22. The only constraint would be that networks 40 and 41 do not both use the same resistor.

Figure 10:
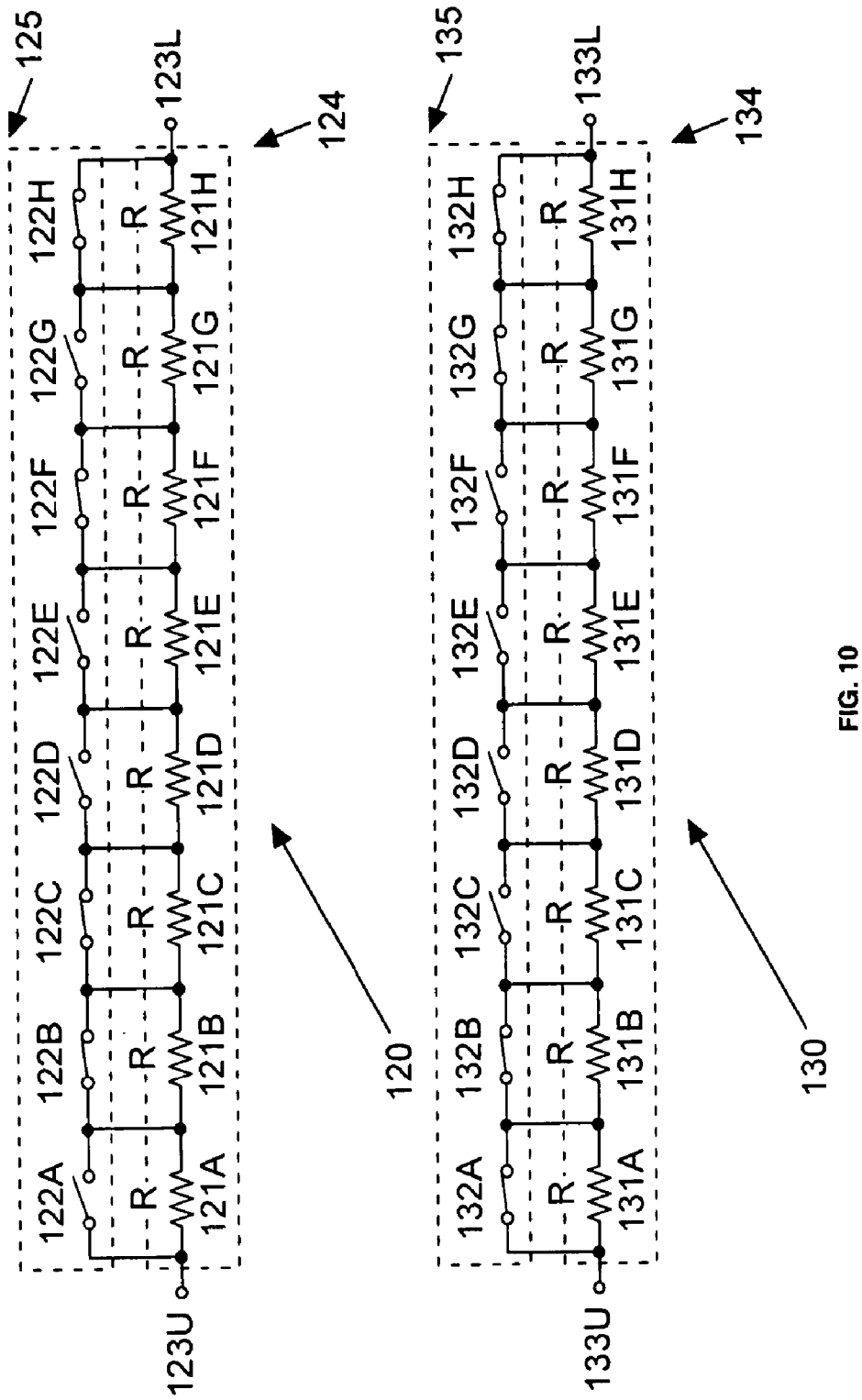
FIG. 10 is a schematic of an embodiment with two pools of resistors, the resistors of each pool being combinable in series combinations.

Another common type of combination of sub-networks would be series connection. Exemplary embodiment 120 of FIG. 10 provides a pool 124 of sub-networks of like kind, resistors, and like measure, resistance. The resistors are series connected. Various combinations can be formed using the set 125 of switches. In the exemplary embodiment of FIG. 10, a network of four series resistors is formed by closing four of the switches 122B, 122C, 122F and 122H. The remaining switches are left open. The value of the network formed has a resistance of approximately 4*R. To apply the invention, a suitable performance criteria would preferably be selected, possibly the absolute value of the resistance. A determination of the performance of various combinations would be made and switch connections would be selected.

FIG. 10 can also be used to illustrate an embodiment for two networks of four resistors whose resistance values are matched. Two pools 124 and 134 of resistors are provided. Resistors from each pool can be combined in series combinations of four resistors each. This creates a network between ports 123U and 123L and between 133U and 133L. Using a performance characteristic of matching the resistance of the resulting networks, determinations would be made of the performance of various combinations and combinations would be selected to approximate the matching condition. Besides illustrating how matched resistors might be formed from series connections of resistors, this example is interesting because it illustrates a situation where the networks may be formed from two pools of sub-networks.

Another application of the method can be examined using the embodiment 120 of FIG. 10. Assuming the user desired to match two networks of series resistors, it would also be possible to form a network between terminals 133U and 133L using an a priori decision to close switches 132A, 132B, 132G and 132H. This choice could be made outside the context of applying the invention, as typically no determination step would be made. The inventive method would then be applied to match the network formed between terminals 123U and 123L to the network between terminals 133U and 133L. This demonstrates that the decision as to whether or not to apply the method to a given pool of sub-networks can be made after the pool of sub-networks is provided. This is useful in that often a user of the method may not know before sub-network fabrication whether or not it is worthwhile to apply the method to the networks to be formed. The user may not know until after sub-network fabrication what combinations to permit. Indeed, after sub-network fabrication some experimentation might be done to determine which combinations should be permitted for use in the method.

Figure 11:
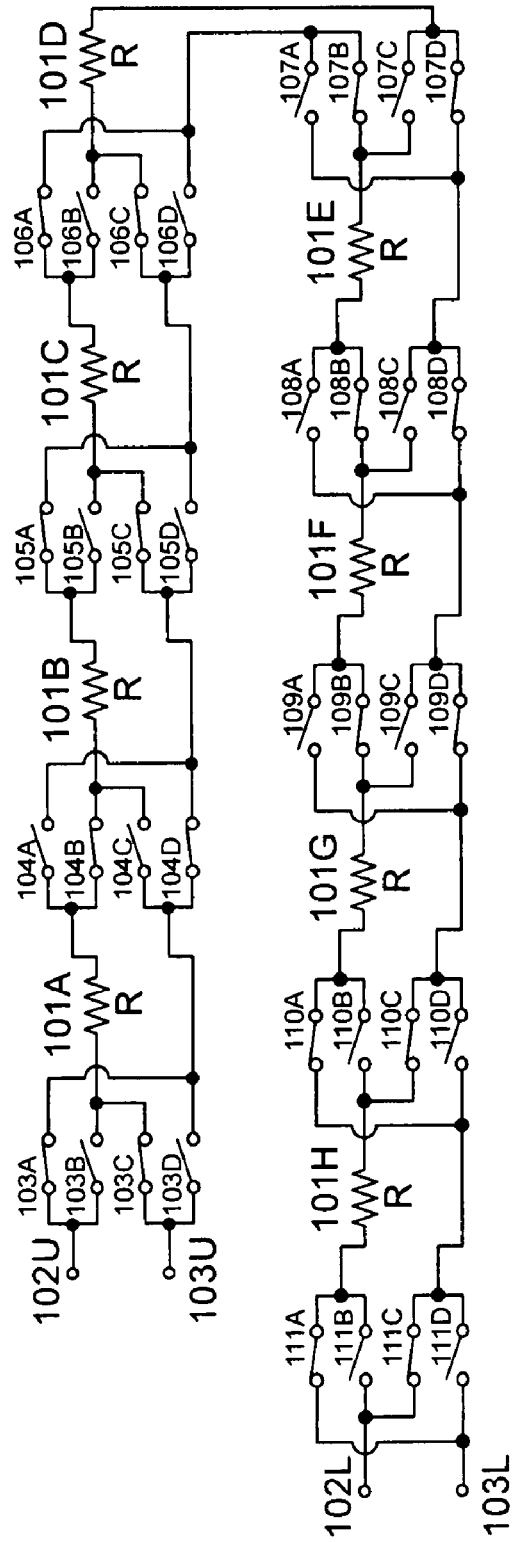
FIG. 11 is a schematic of an embodiment with one pool of resistors, the resistors being combinable so as to form two series combinations.

Another exemplary embodiment 100 of a method for forming matched series resistors is illustrated in FIG. 11. The embodiment 100 provides one pool of resistors, comprised of resistors 101A-101H, which can be combined to form two networks of four resistors in series. FIG. 11 exemplifies the situation where a determination is made that an approximation of the desired performance characteristics is achieved by selecting resistors 101A, 101B, 101D and 101H to form a network between terminals 102U and 102L, and resistors 101C, 101E, 101F, and 101G to form a network between terminals 103U and 103L. This example, in comparison to the exemplary embodiments 120 and 130 of FIG. 10, serves to show that topologically equivalent networks can be formed according to the method using different pools and different manners of combining. The method allows the user quite a bit of latitude in the choice of pools, combinations, and desired performance characteristics.

Figure 12:
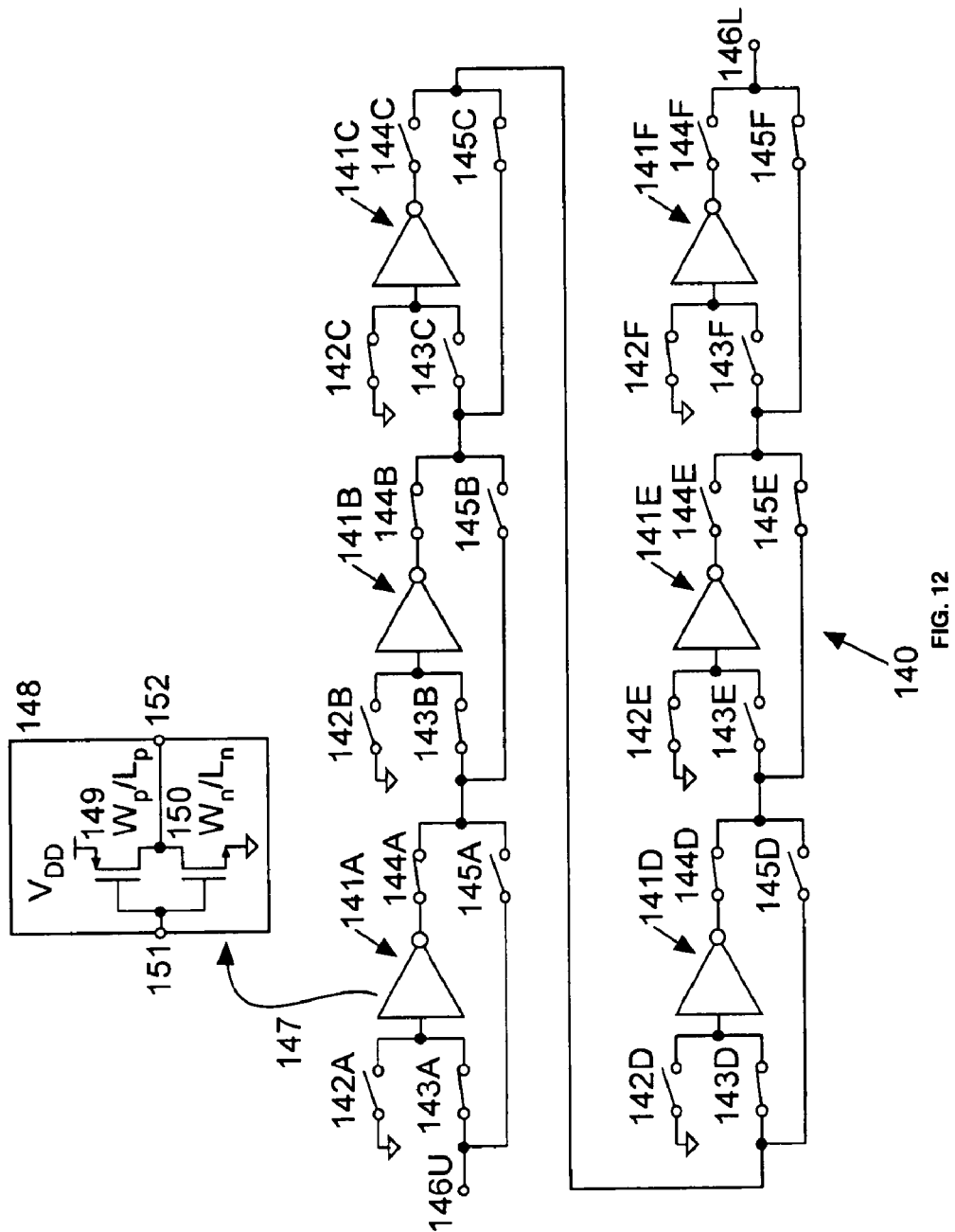
FIG. 12 is a schematic of an embodiment in which inverters are combinable in cascade combinations.

Embodiment 140 of FIG. 12 exemplifies an arrangement of sub-networks of like kind and like measure combined in cascade. Arrow 147 illustrates that each inverter is composed of a PMOS and NMOS transistor. The PMOS transistors in each inverter have a nominal size of $W_p/L_p$. The NMOS transistors have a nominal size of $W_n/L_n$. Thus, the sub-networks 141A-141F are of like kind and like measure. The sub-networks can be combined in cascades of three inverter sub-networks to form the desired network. FIG. 12 shows an exemplary selection in which inverters 141A, 141B and 141D are combined in cascade. Inverters 141C, 141E and 141F are unused. For this example a desired performance characteristic would be the delay through the inverter chain. This and the preceding examples are meant to illustrate common types of combinations—parallel, series, and cascade. Other types of combinations will be apparent to those skilled in the art.

After providing a pool of sub-networks of like kind and like measure, a determination can be made of the performance of each combination of sub-networks relative to a set of desired performance characteristics. This may be accomplished in different manners. For example, it may include the testing the combinations to determine their performance. For a second example, it may include empirically determining the performance—that is, it may be based at least in part on experience and/or observation. Most notably, the performance of some combinations may be computed based on the testing of other combinations. Of particular interest is the case when the combinations combine linearly. When this occurs, if there are N sub-networks, then only N linearly independent combinations need to be tested. From these N tests, the performance of all the other combinations can be calculated.

Figure 13:
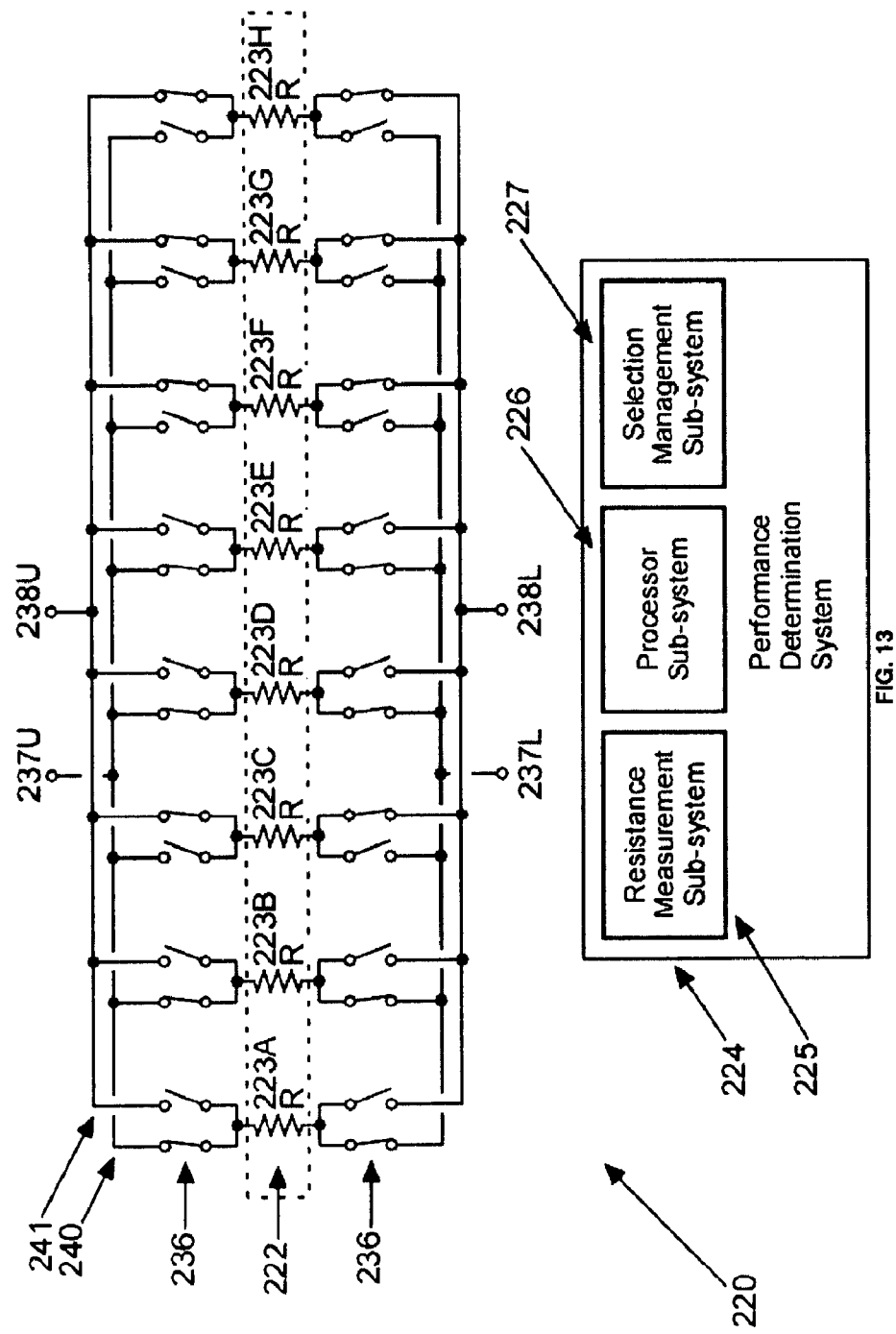
FIG. 13 is a schematic of an application of the invention to forming two electrical networks of four parallel resistors each.

Embodiment 220 of FIG. 13 exemplifies an apparatus for forming two electrical networks of four parallel resistors each. The apparatus comprises one pool 222 of resistor sub-networks 223A-223H of like measure, resistance of value R, and a system for determining the performance of the networks relative to the desired performance characteristic. One exemplary performance characteristic would be the relative matching of resistance values of networks 240 and 241. The sub-networks 223A-223H can be selectively connected to implement the two parallel resistor networks. An exemplary implementation of the system for determining the performance of the combinations of sub-networks 224 comprises a resistance measurement sub-system 225, a processor sub-system 226, and a selection management sub-system 227. The function of the selection management sub-system is to command banks of switches 236 to form various combinations of sub-networks. The resistance measurement sub-system measures the resistance of each network implementation. The processor sub-system analyzes the measurements, decides the desired combination for selection, and passes the decision to the selection management sub-system. The selection management sub-system then connects the chosen combinations of resistor sub-networks to implement the parallel resistor networks.

The situation may arise that an empirical determination can be made that the approximation of the performance criteria may be enhanced by combinations with certain spatial arrangements. In other cases, it may be desirable to reduce the number of total combinations examined by allowing only certain spatial arrangements of sub-networks and networks. Permitting combinations only having certain spatial arrangement may serve to limit the number of combinations that need to be measured for their performance.

Figure 14:
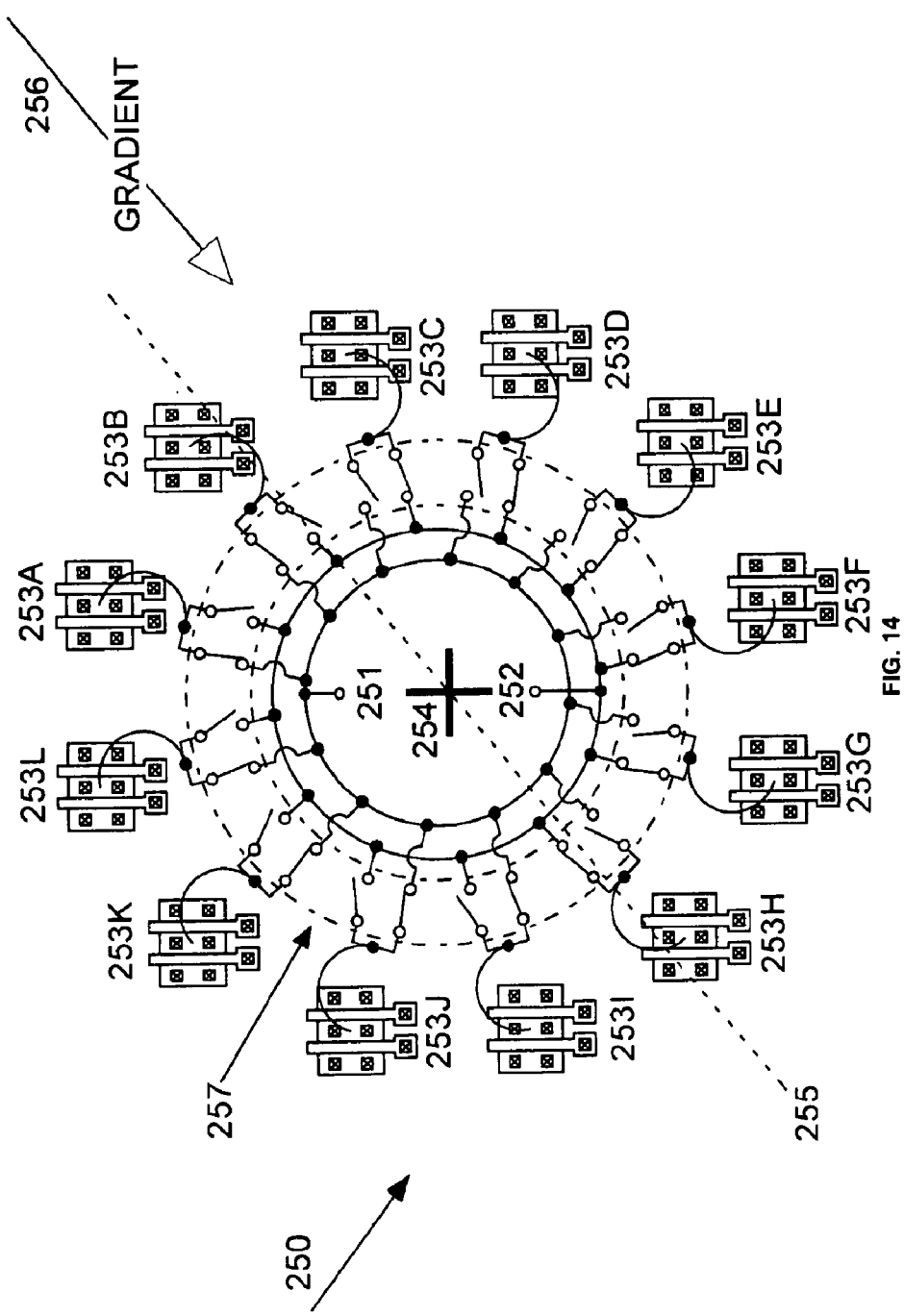
FIG. 14 is a schematic of an application of the invention to the formation of symmetrically arranged sub-networks.

Embodiment 250 of FIG. 14 depicts a symbolic layout of twelve sub-networks 253A-253L of like kind (MOSFET's), and like measure (symbolically depicted by equal gate lengths and widths). The sub-networks are arranged symmetrically around a center of symmetry 254. A bank of switches 257 is provided to combine the sub-networks. In this example it is desired to form two networks of six MOSFET's in parallel such that the networks produce matching currents at output terminals 251 and 252. The drains are pictorially connected to the switches; the remaining circuitry to establish a gate-source voltage is not shown. In this embodiment, combinations of six MOSFET's are allowed if they all lie on the same side of a line of symmetry (which passes through the center of symmetry). FIG. 14 illustrates the case when one network is formed from the combination of MOSFET's 253A, 253B and 253I-253L and the other network from MOSFET's 253C-253H. In FIG. 14, MOSFET's 253C-253H lie to one side of line of symmetry 255, while MOSFET's 253A, 253B and 253I-253L lie to the other side of the line of symmetry. In the depicted case, a gradient is presumed to exist in the direction shown by the gradient arrow 256. Choosing a line of symmetry parallel to the gradient allows for some balancing between the two networks. For example, MOSFET 253B should balance with MOSFET 253C. Similarly, MOSFET 253K should balance with MOSFET 253F. Although combinations that do not divide along a line of symmetry are possible, it can be desirable to use spatial arrangements to limit the number of performance determinations that are made.

It may also arise that an empirical determination can be made that the approximation may be enhanced by the spatial distance between sub-networks of the combination. Likewise, an empirical determination may be made that the approximation is enhanced by the spatial distance between networks. In some embodiments, for example, the approximation may be enhanced if the sub-networks have substantially no spacing between them (i.e., they are arranged in a common arrangement). In other forming embodiments, the approximation may be enhanced if the networks are arranged in an overlapping common arrangement (i.e., they have a limited spacing). In other cases, it may be desirable to reduce the number of total combinations examined by allowing only certain spatial distances between sub-networks or networks. Permitting combinations only having certain spatial distances may also serve to limit the number of combinations that need to be measured for their performance.

In cases where the random variations of the sub-networks are a result of several random processes, it is often possible to decompose the associated variations in measured data into effects attributable to specific random processes. This decomposition can be performed with principal component analysis (PCA) or other similar techniques (blind source separation, independent component analysis, etc.). Once the variations in the sub-networks are decomposed into distinct effects, it is possible to determine the amount of a given effect present in each combination. Selective connection can then be done based on this determination step involving a decomposition procedure. The amount of each effect present can even be utilized as a performance characteristic.

Figure 15:
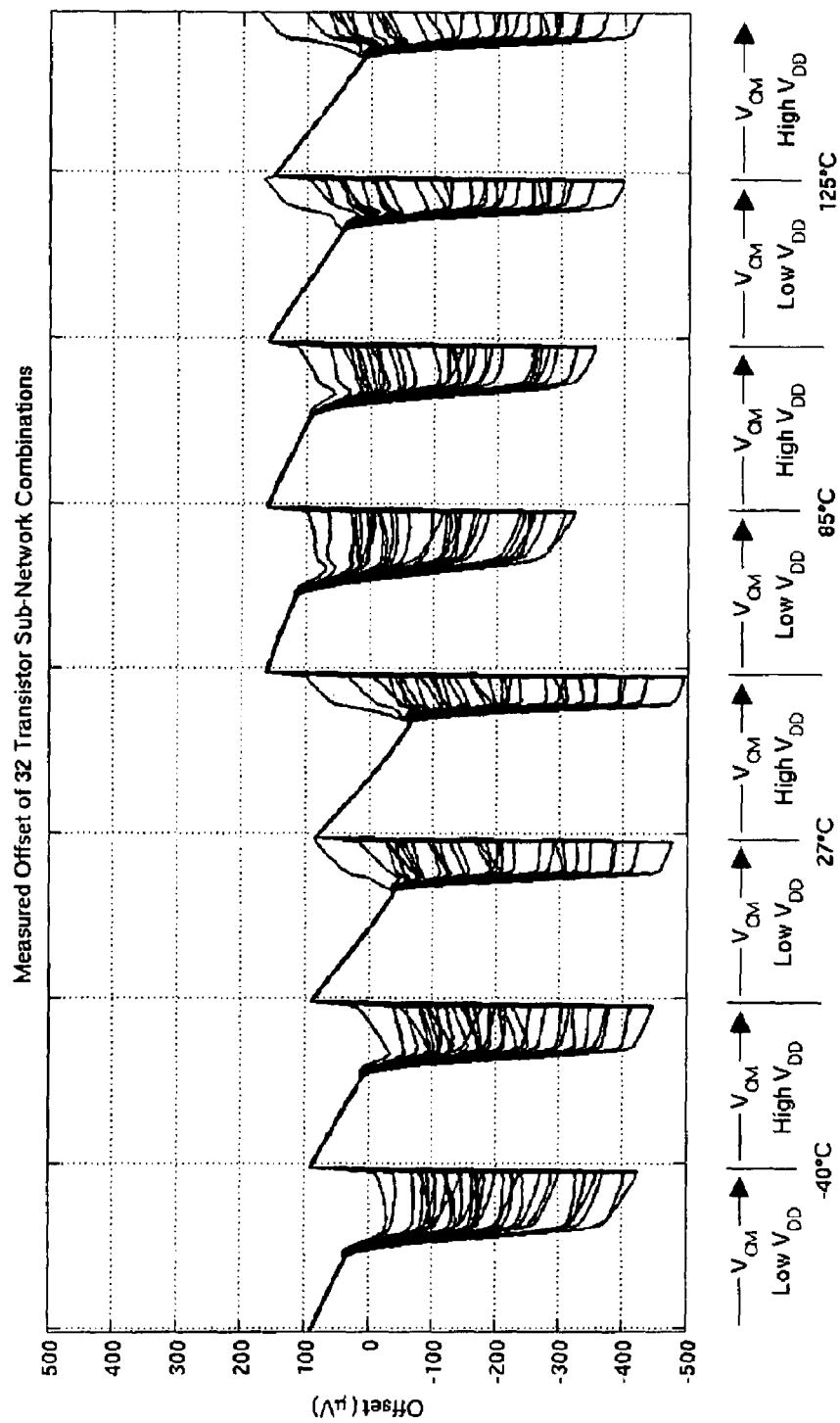
FIG. 15-FIG. 26 are traces of offset voltage versus input common mode voltage, supply voltage and temperature with a background offset (FIG. 15), with the background offset removed (FIG. 16), for the contribution of each input NMOS transistor sub-network to the measured offset (FIG. 17), for the uncorrelated NMOS transistor effects that contribute to the offset (FIG. 18), of the offset for all possible allowed combinations of input NMOS devices (FIG. 19), of the expected offset when the smallest RMS offset is selected for the current example (FIG. 20), of the offset when the first effect of FIG. 18 is not suppressed while the other three effects are suppressed (FIG. 21), of the amount each effect of FIG. 18 contributes to the total offset (FIG. 22), of the offset resulting from the combination of NMOS and PMOS input sub-networks with the smallest root-mean-square offset (FIG. 23), comparing the resulting offset of separate determinations of NMOS and PMOS combinations to a joint determination (FIG. 24), of the four most significant offsets caused by various combinations of input devices for several amplifiers (FIG. 25), and of the effects of the same characterization as for FIG. 25 performed at room temperature (FIG. 26)
Figure 16:
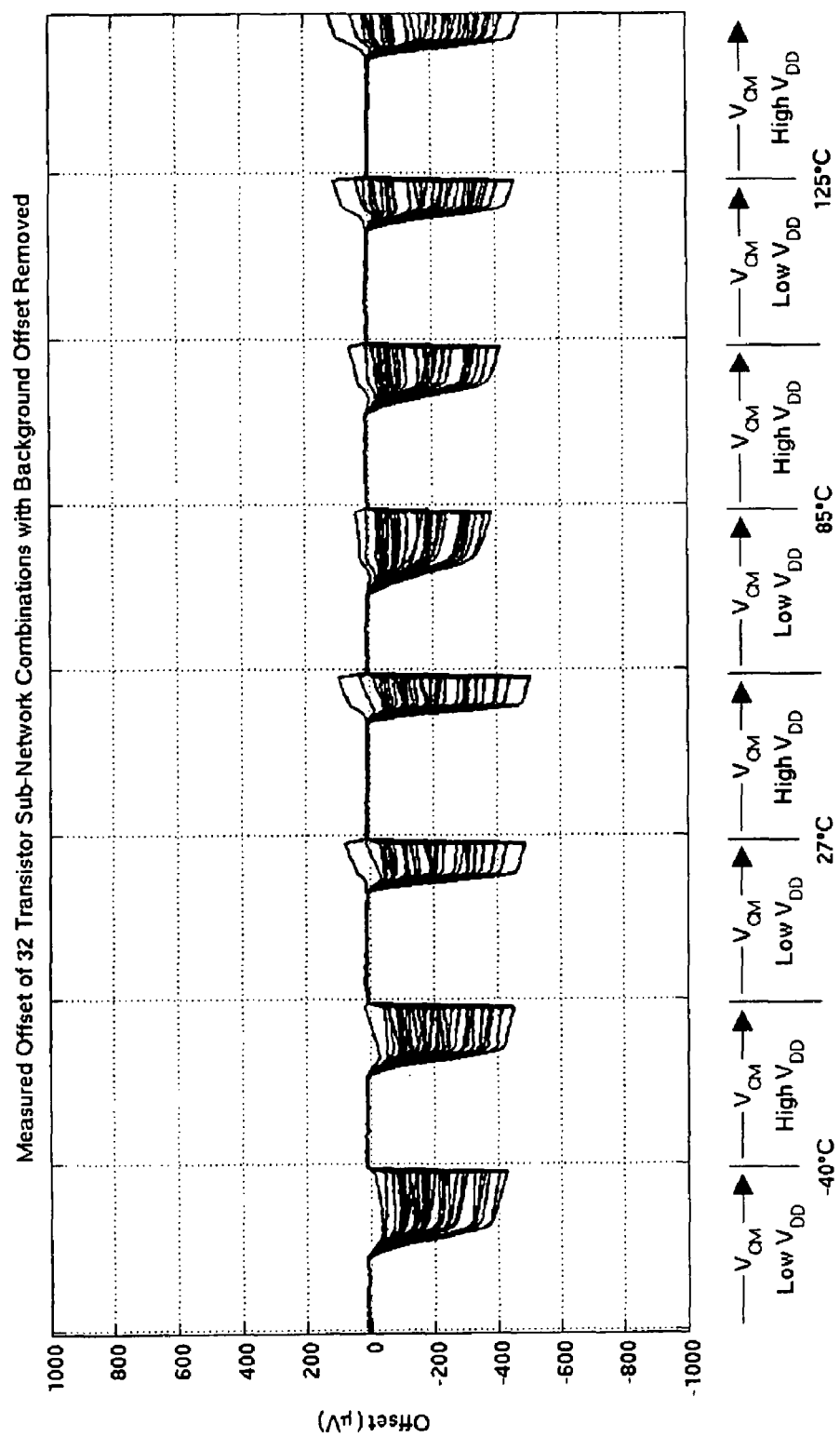
Figure 17:
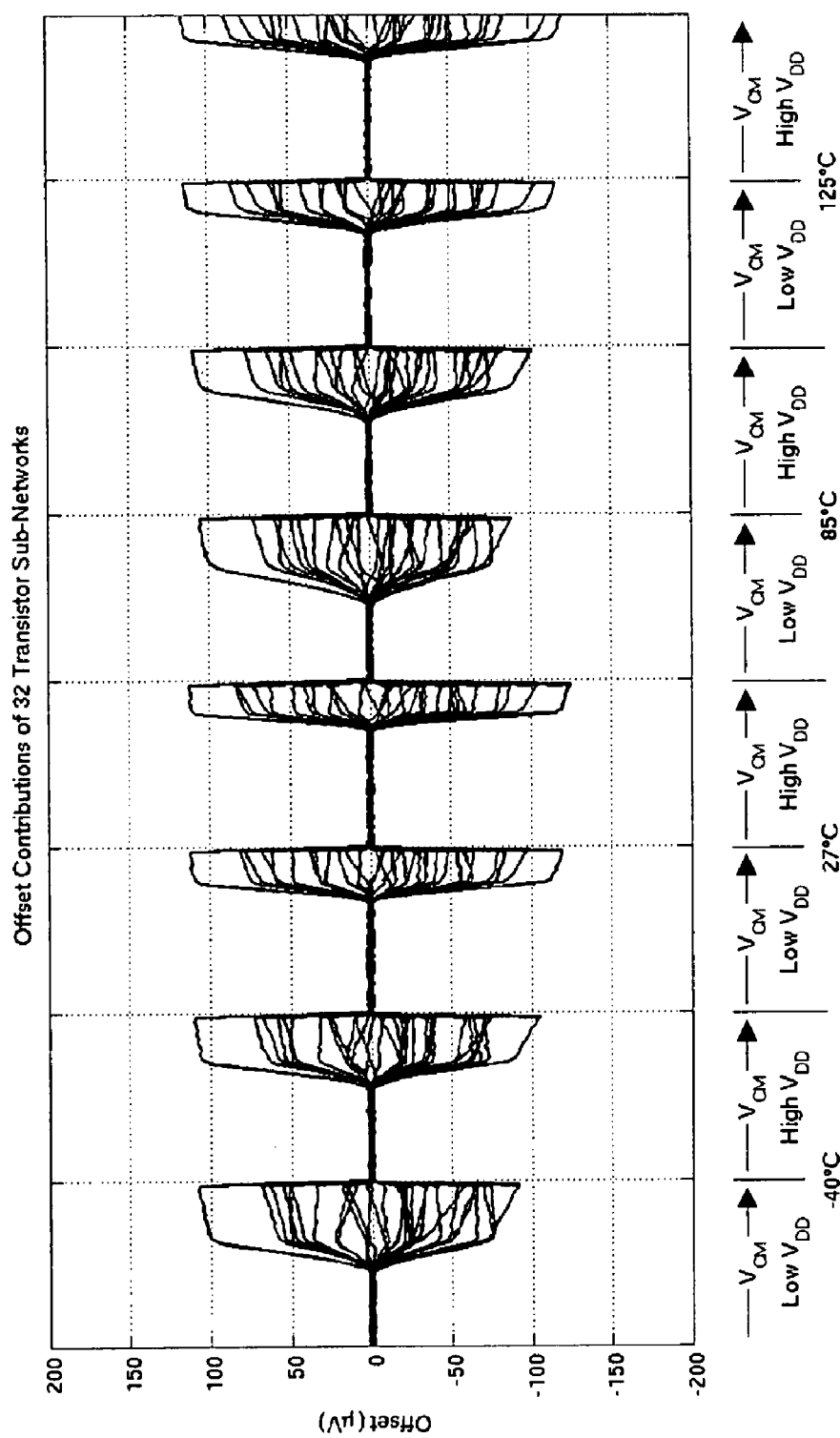
Figure 18:
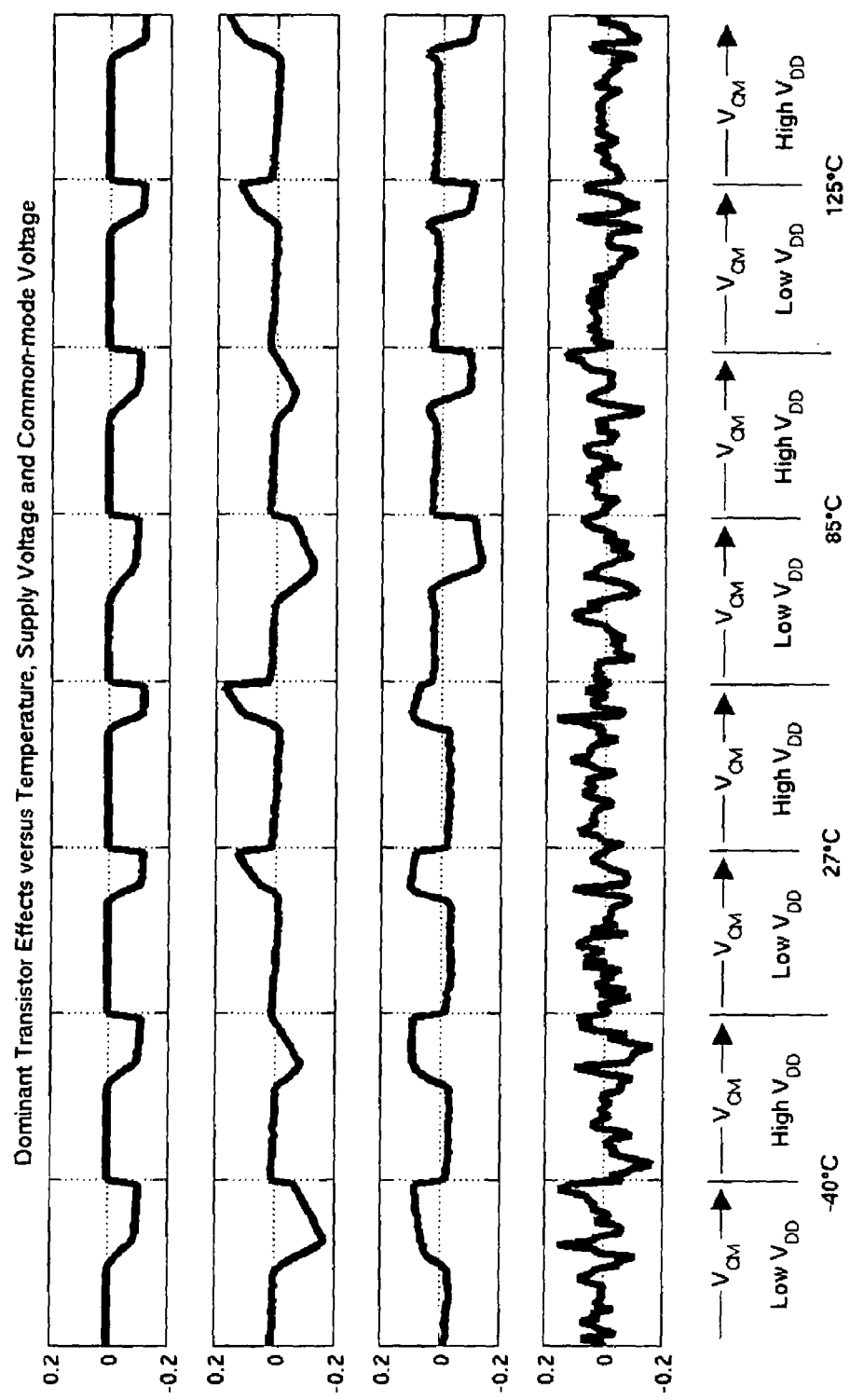
Figure 19:
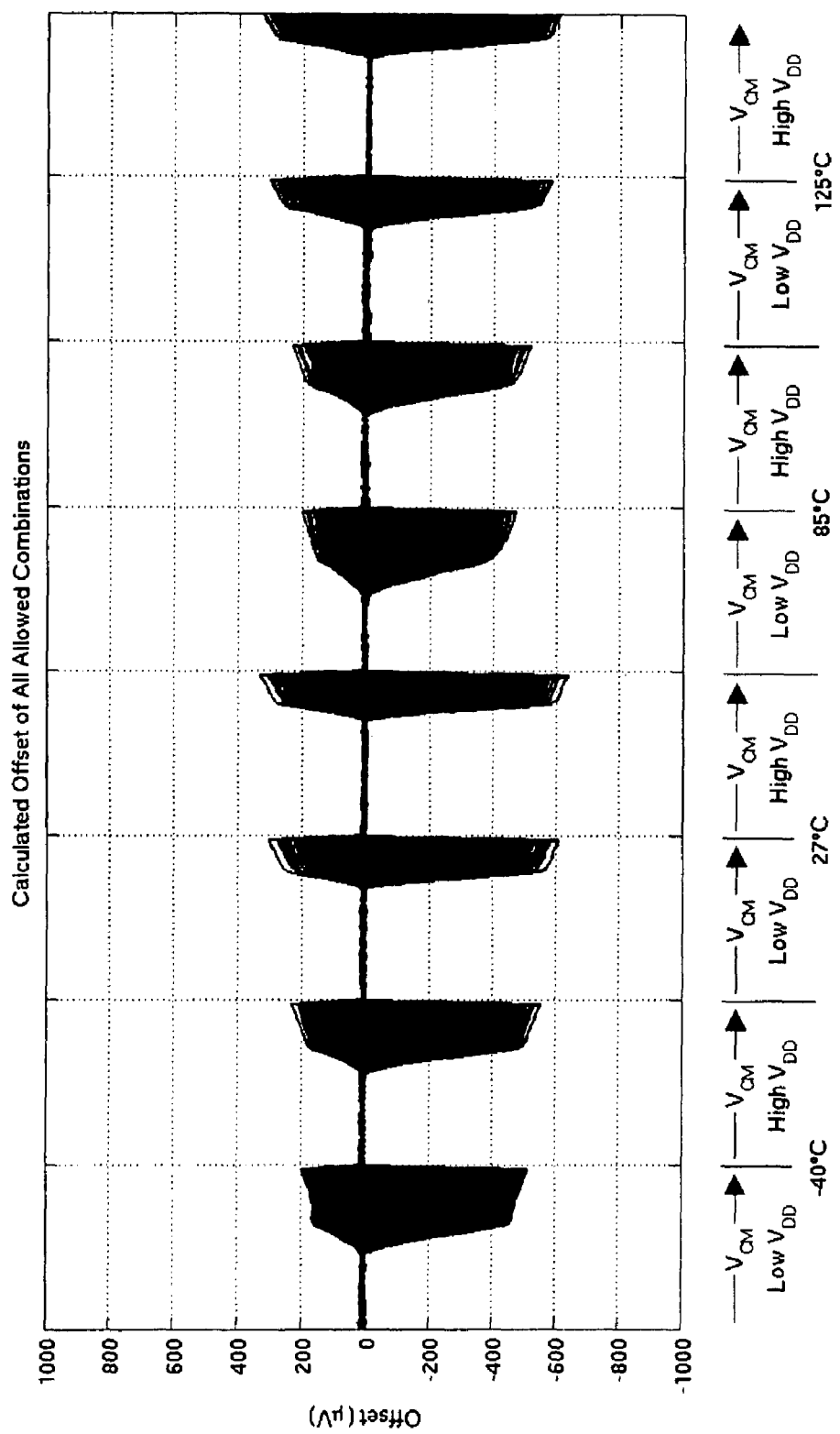
Figure 20:
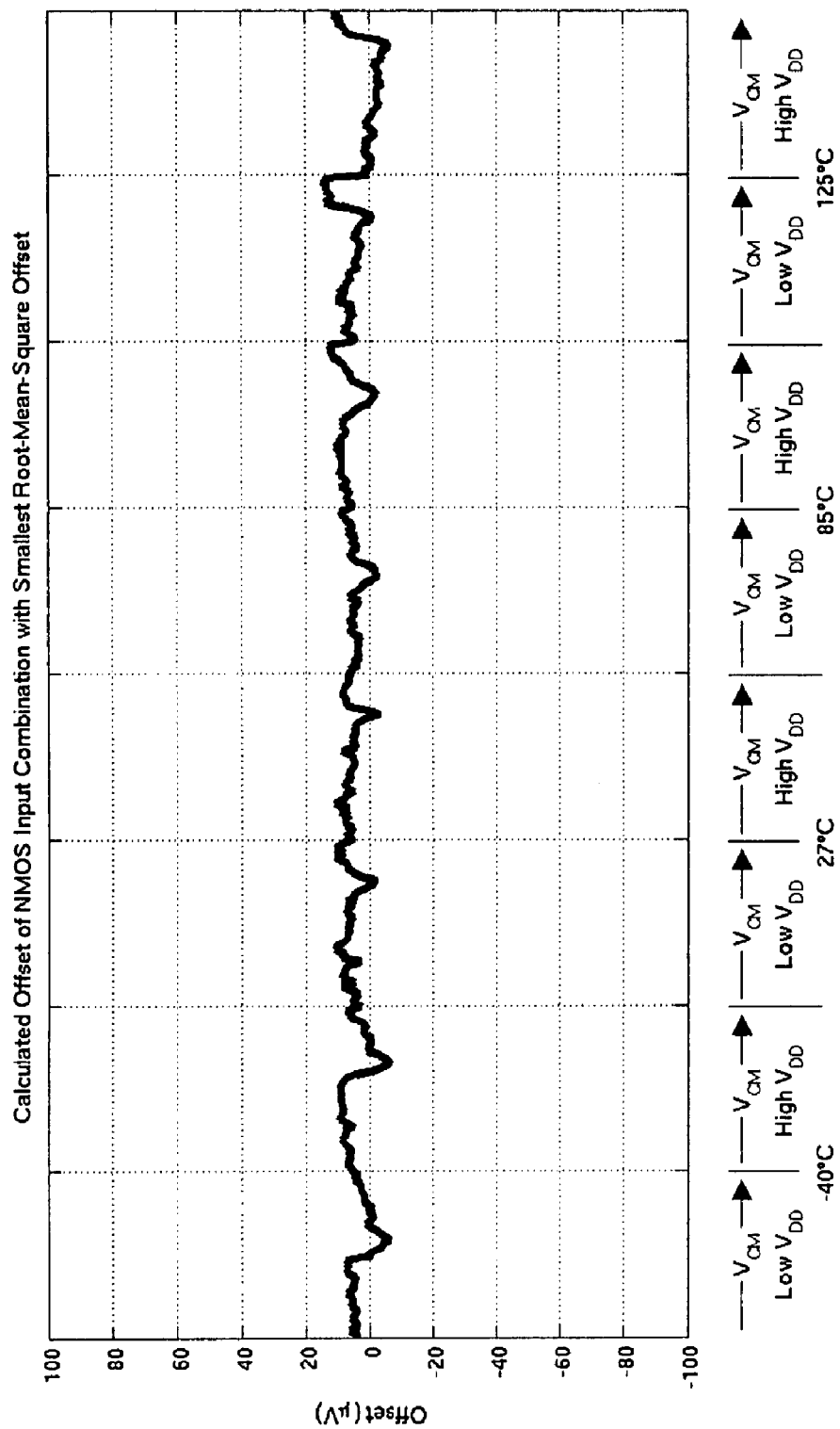
Figure 21:
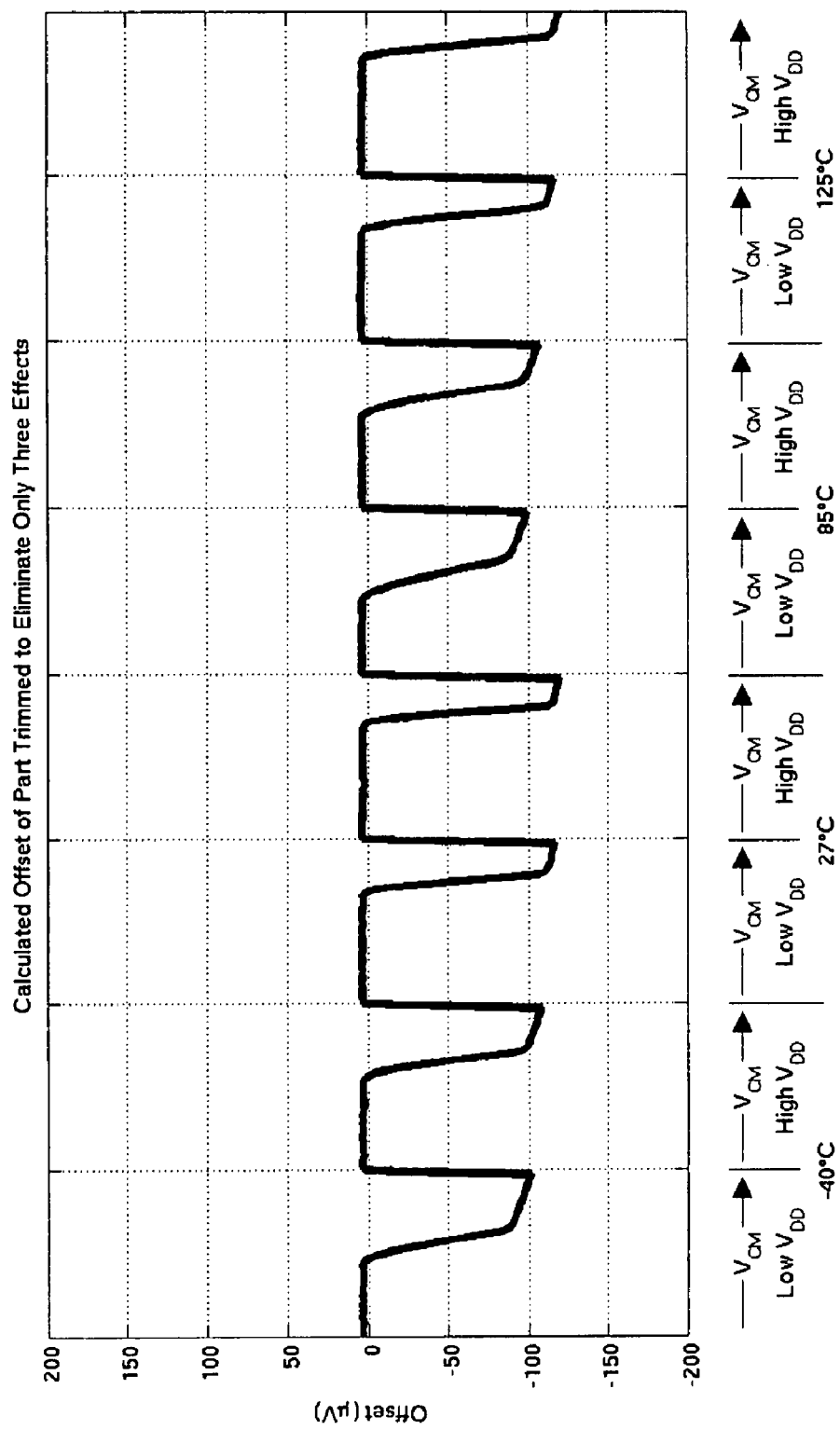
Figure 22:
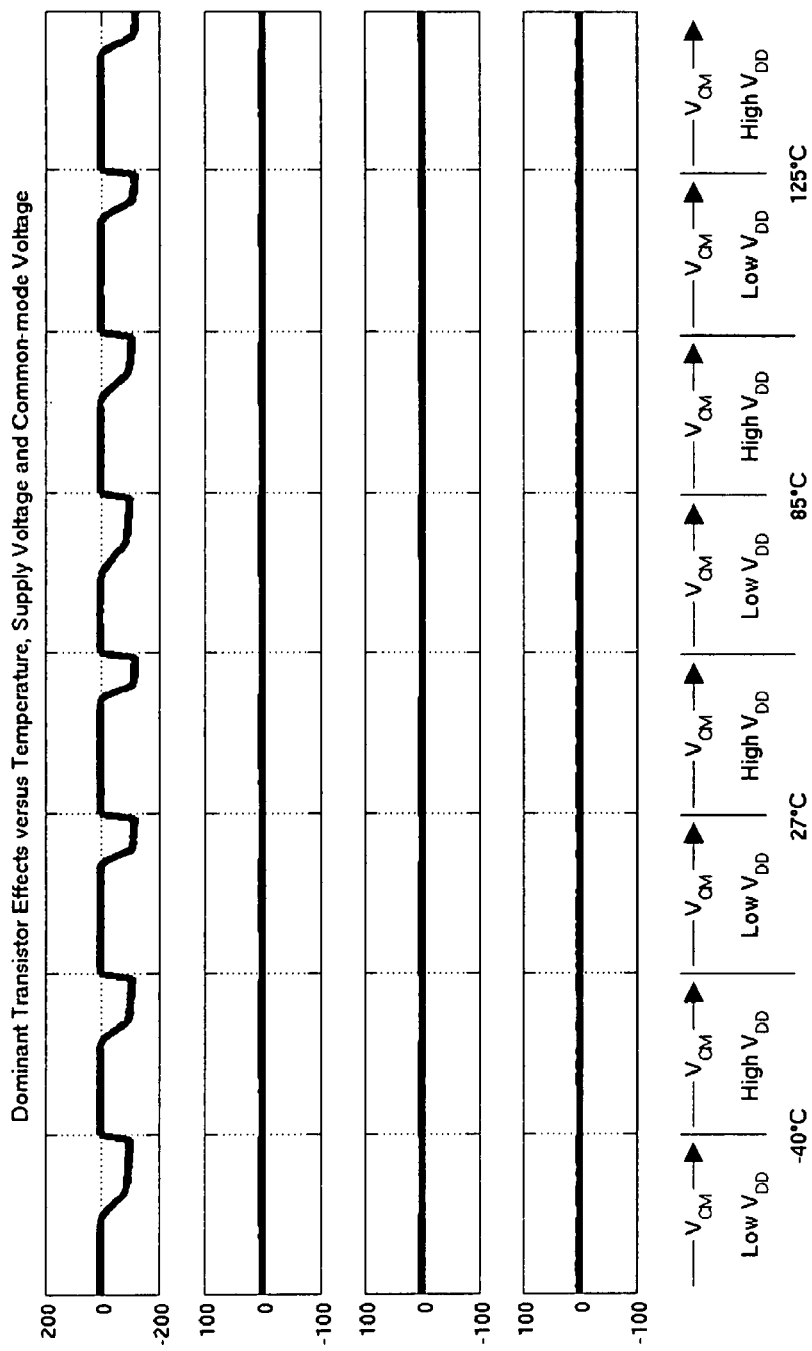

For example, it has been found that in MOS amplifiers, the dominant effect that causes room temperature offset voltage is not the dominant cause of temperature coefficient of offset voltage, $TC_{VOS}$. However, using the invention it is possible to measure the offset voltage at different bias points and temperatures and then decompose the sub-network variations into uncorrelated random processes. Each process generates a specific effect in the measurements. Each sub-network will contribute a specific amount of each effect. FIG. 15 shows offset voltage versus input common mode voltage, supply voltage and temperature for thirty-two combinations of sub-networks of input NMOS transistors of an operational amplifier integrated circuit. It can be noticed in FIG. 15 that a considerable amount of offset does not change when changing the trial combination. This offset is attributable to other offset mechanisms in the operational amplifier (which can also be selectively reduced using the invention). This background offset is removed in FIG. 16. It has been found that the offset of a combination is a linear combination of the sub-network contributions to a good approximation. With that knowledge, it is possible to solve for the contribution of each input NMOS transistor sub-network to the measured offset. This is shown in FIG. 17. It is also possible to solve for the uncorrelated effects which comprise the sub-network contributions. For the NMOS input transistors there are roughly four effects that have a significant contribution. These effects are shown in FIG. 1. The scaling factor of the effect waveforms is somewhat arbitrary, but has been chosen to give each effect a unit magnitude when treated as a vector. Continuing the example of the application of the technique, FIG. 19 illustrates the offset for all the possible allowed combinations of input NMOS devices. Typically, the combination that has the smallest root-mean-square (RMS) offset is selected for final connection. FIG. 20 illustrates the expected offset when the smallest RMS offset is selected for the current example. However, it is also possible to suppress only some of the offset effects present. This can be done by applying the invention to a performance characteristic associated with the mean-square-error contribution of some of the effects and not others. As an example, the RMS error associated with the last three effects of FIG. 1 can be employed as performance characteristics, thereby neglecting the contribution of the first effect during the determination and selection steps. FIG. 21 illustrates the result when the first effect is not suppressed while the other three effects are suppressed. Clearly a large offset results which follows the shape of the first effect. This can be seen more clearly by plotting the amount each effect is contributing to the total offset, as shown in FIG. 22. It can be seen that the first effect remains while the other three have been largely suppressed. This demonstrates that decomposing the variations into separate effects, and attaching one or more performance characteristics to these effects, allows for a more flexible technique.

A further benefit of decomposing measured data into principal components or other like data sets is that it can greatly reduce the amount of computation needed for the determination step. In the example of the NMOS input stage discussed above, measurements of the offset were taken at 280 different bias and temperature conditions for each measured combination. There were 12870 allowed combinations. If the RMS offset were calculated for each combination on all 280 bias points, it would require roughly 3.6 million numbers to be squared (and many additions and multiplications would need to be done as well). When the data is decomposed into the four major effects, only 51480 numbers must be squared. Clearly, the ability to decompose each sub-networks behavior into uncorrelated effects can have tremendous computational advantages.

Figure 23:
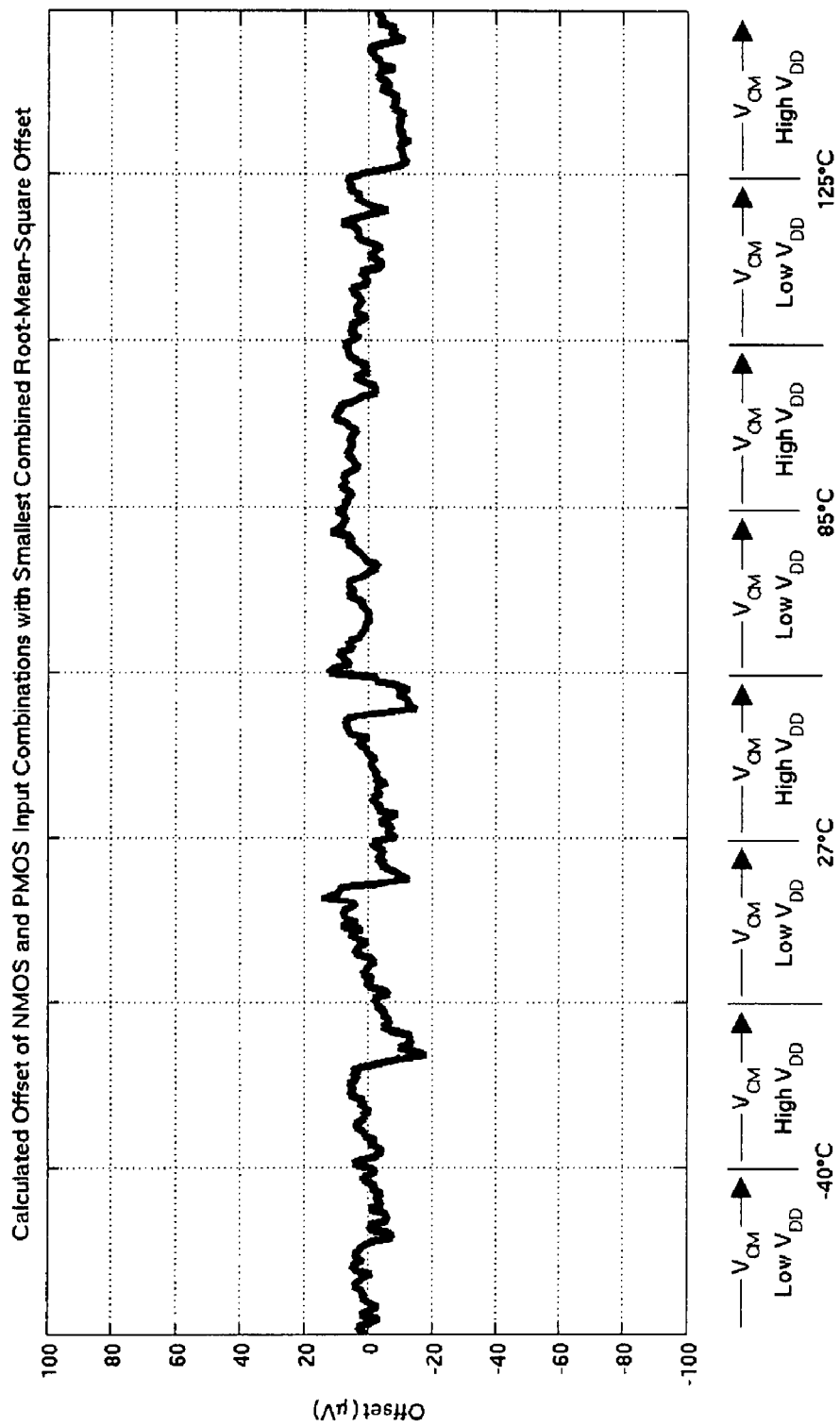
Figure 24:
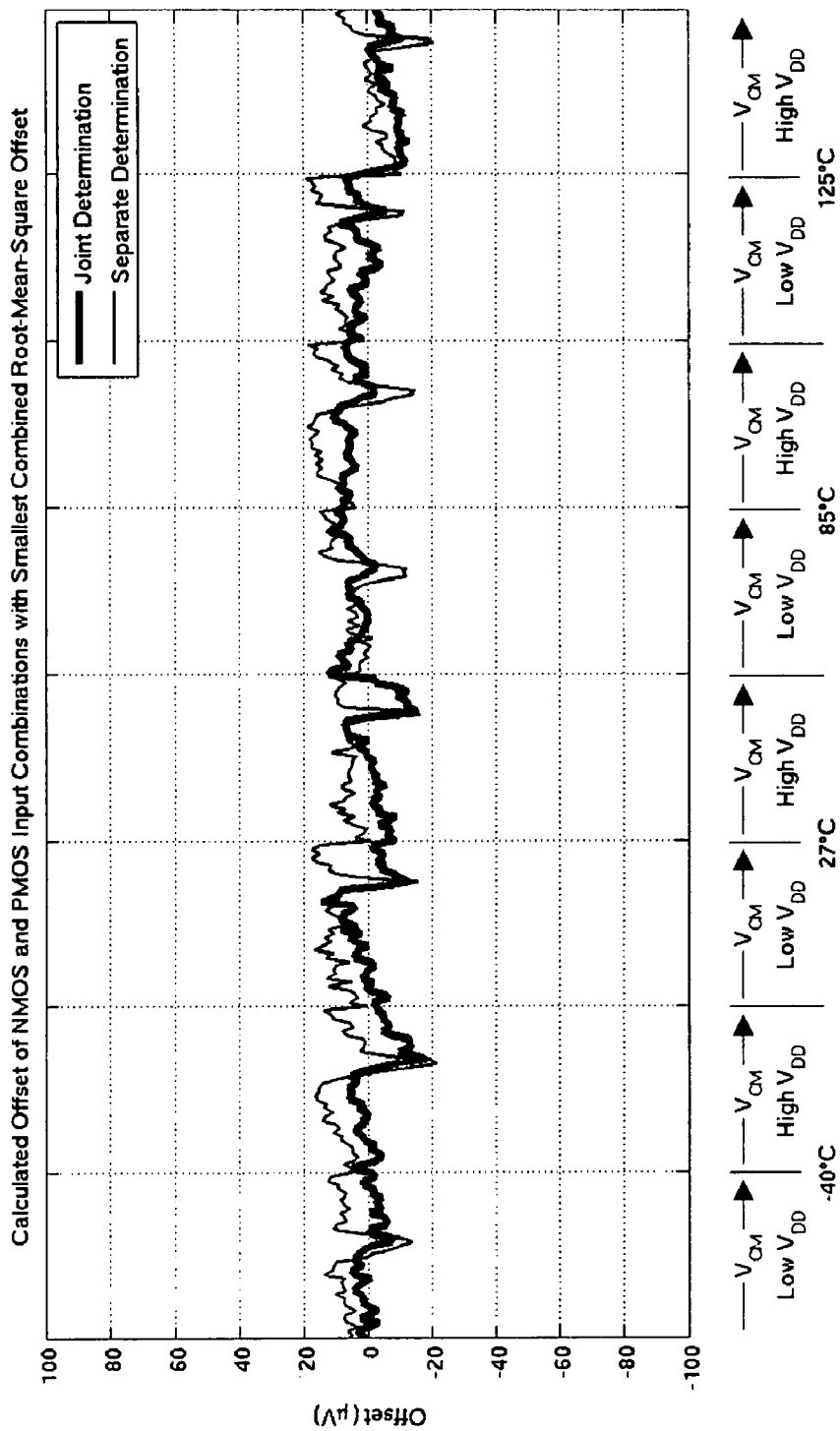

A continuation of the above example can be used to demonstrate the ability of the method to handle multiple pools of sub-networks where the pools are of different kind and measure. In an exemplary embodiment of the method, separate pools of NMOS and PMOS input sub-networks, forming NMOS and PMOS differential pairs, are established. The NMOS sub-networks are of like kind and measure, and the PMOS sub-networks are of like kind and measure. The sub-networks can be combined in numerous combinations. The contribution of each sub-network to the measured offset voltage can be determined. From this, a determination of the performance of the joint NMOS and PMOS combinations can be made. That is, it is possible to see how the offset voltage across various measurement conditions, taken as a performance characteristic, can be minimized for each NMOS combination and PMOS combination. If there are 1000 NMOS combinations and 2000 PMOS combinations, there would be 2,000,000 joint combinations for which to make determinations. The result of such a procedure is shown in FIG. 23. FIG. 24 compares the result one obtains if the determination of the NMOS and PMOS combinations are done separately, shown in the thin black line, versus a joint determination, shown in the thick black line. It is clear that the joint determination and selection provides a lower offset. The preceding example clarifies the fact that the determination and selection steps can be done on two or more pools of like kind and measure, in which the differing pools are of differing kind or measure.

Another embodiment of the invention allows the determination to be made by means of an estimator. It has been found that, based on room temperature offset voltage measurements of the sub-network combinations, estimates of the behavior of the combinations at other temperatures can be made. This estimated behavior is then used to make the determination of the performance of combinations, prior to the selective connection step. The performance characteristics can also be tailored for the cross-temperature behavior. A straight-forward way of doing the estimation is to decompose the room temperature behavior of the sub-networks into uncorrelated random processes. Through a characterization process, these room temperature processes can be correlated to random processes operating across temperature. Using techniques from signal theory, the estimator is readily formed. The estimator yields an estimate of the cross-temperature processes given room temperature processes.

Figure 25:
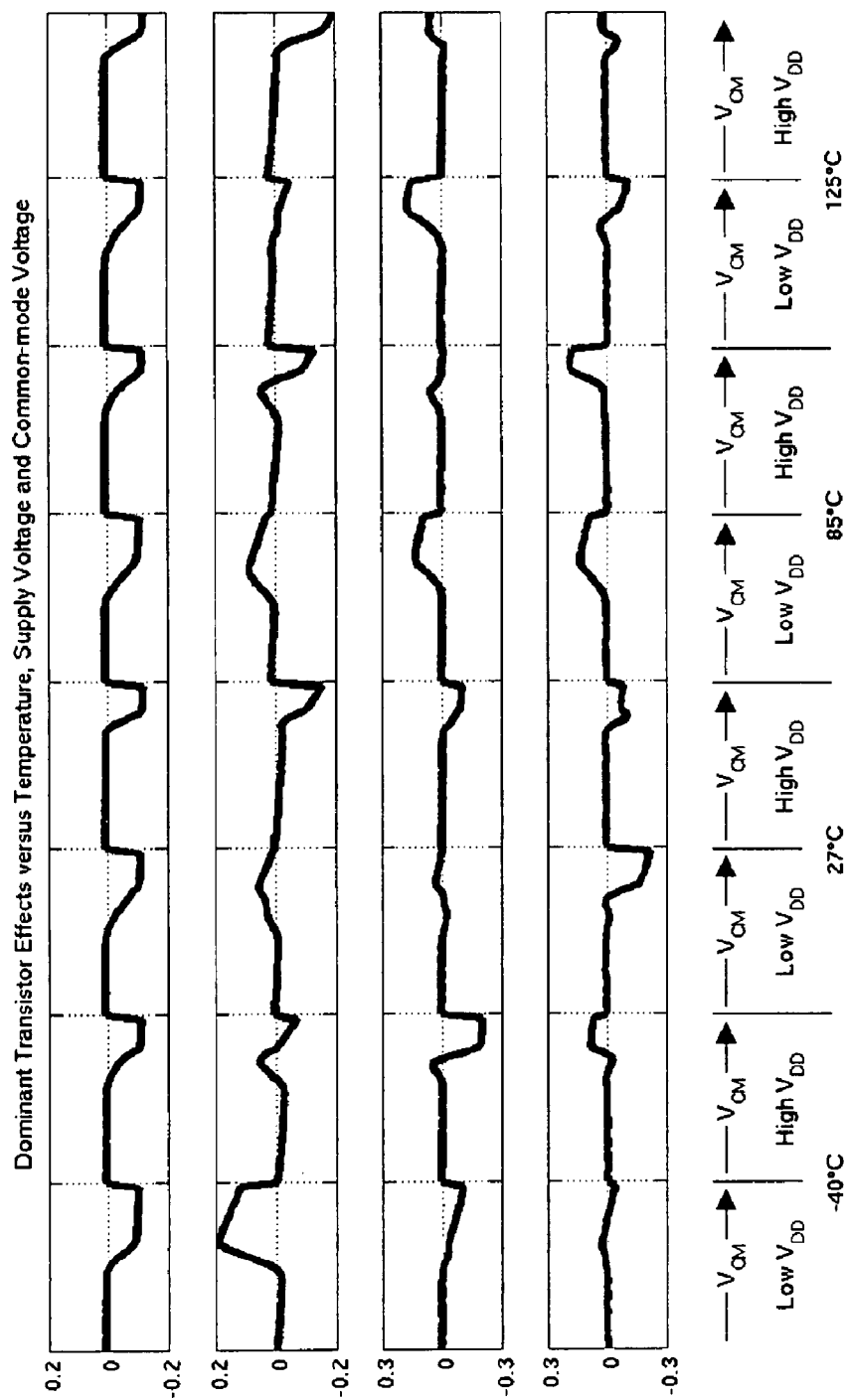
Figure 26:
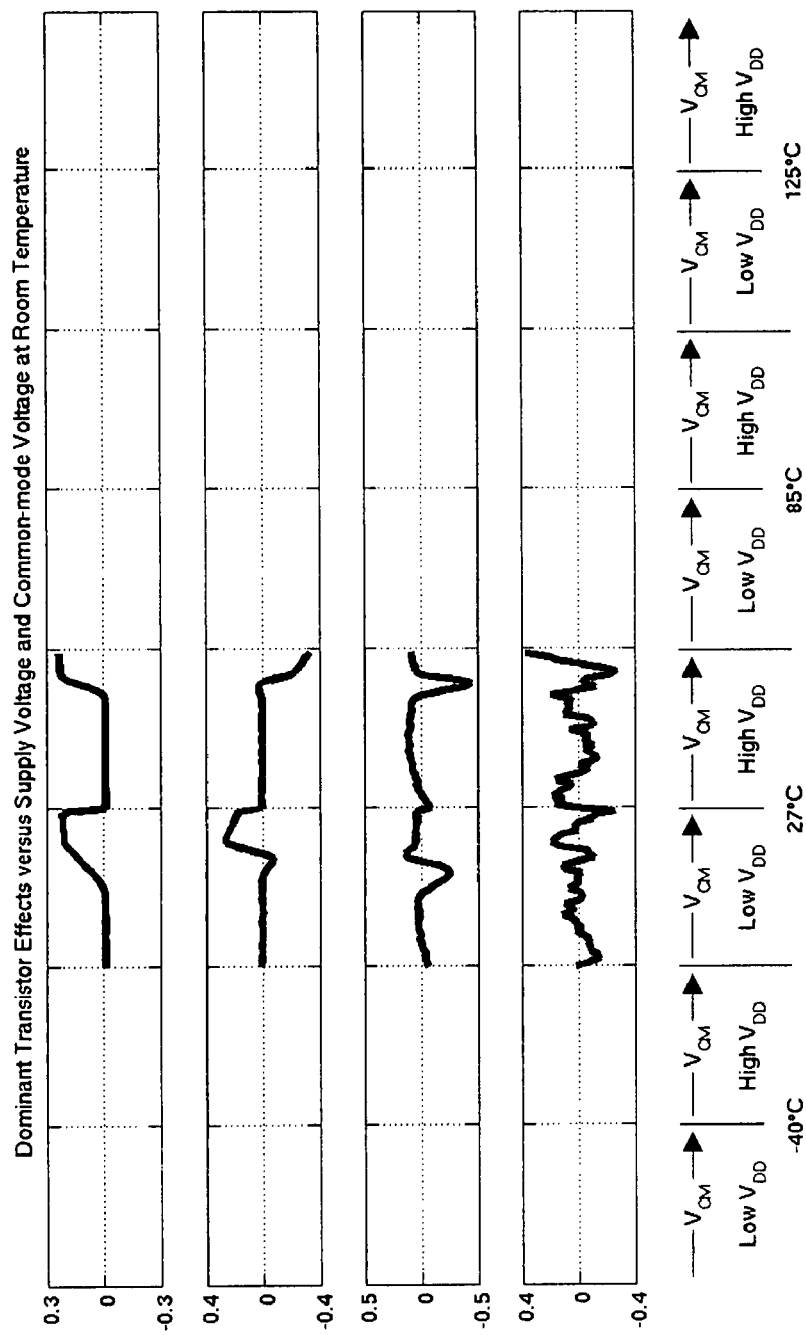
Figure 27:
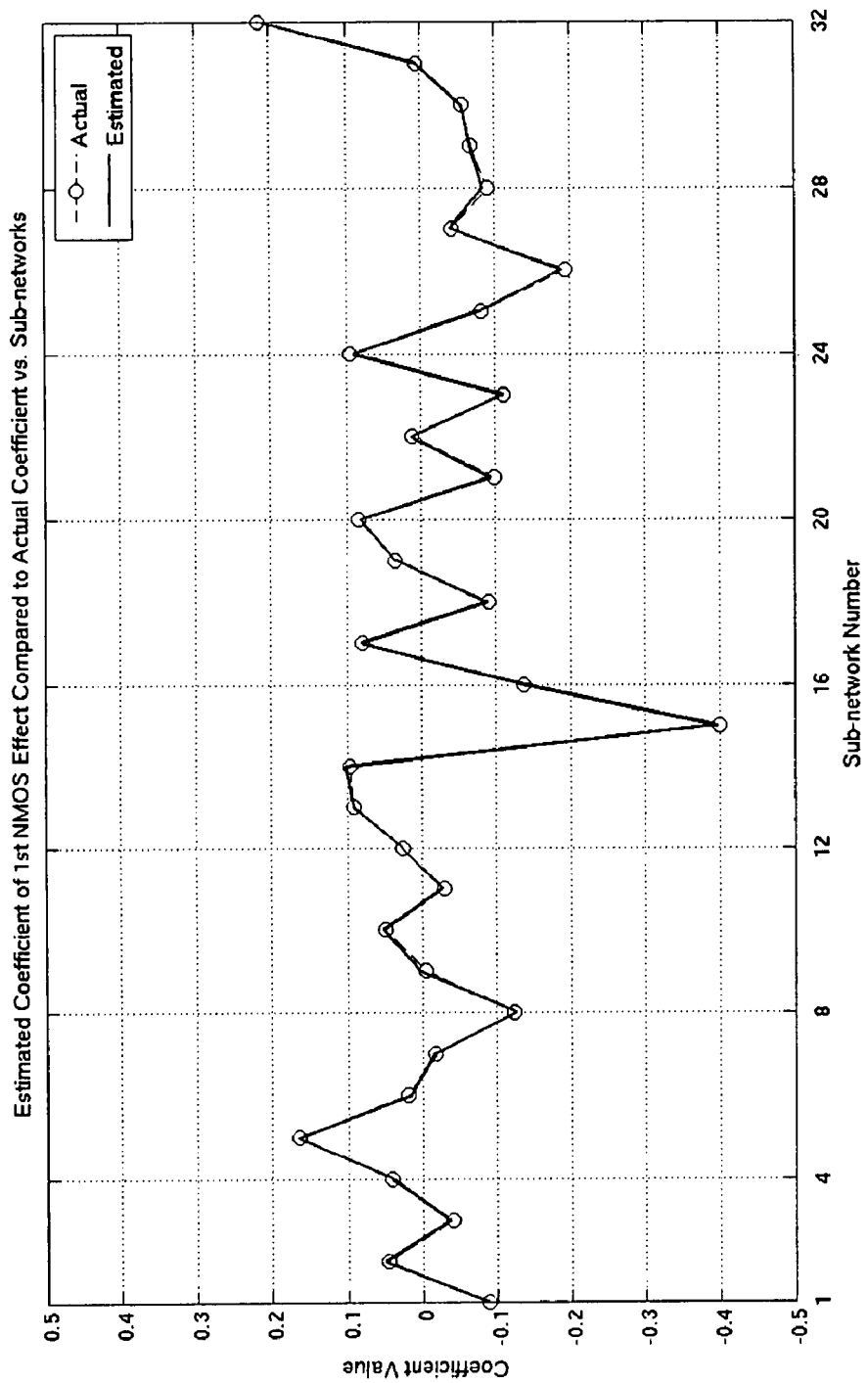
FIG. 27, FIG. 28, FIG. 29 and FIG. 30 are graphs of estimated cross-temperature coefficients, based upon the correlation of the room temperature variations to the cross-temperature variations, versus the actual coefficients and the sub-network numbers for the first, second, third and fourth effects of FIG. 18, respectively.
Figure 28:
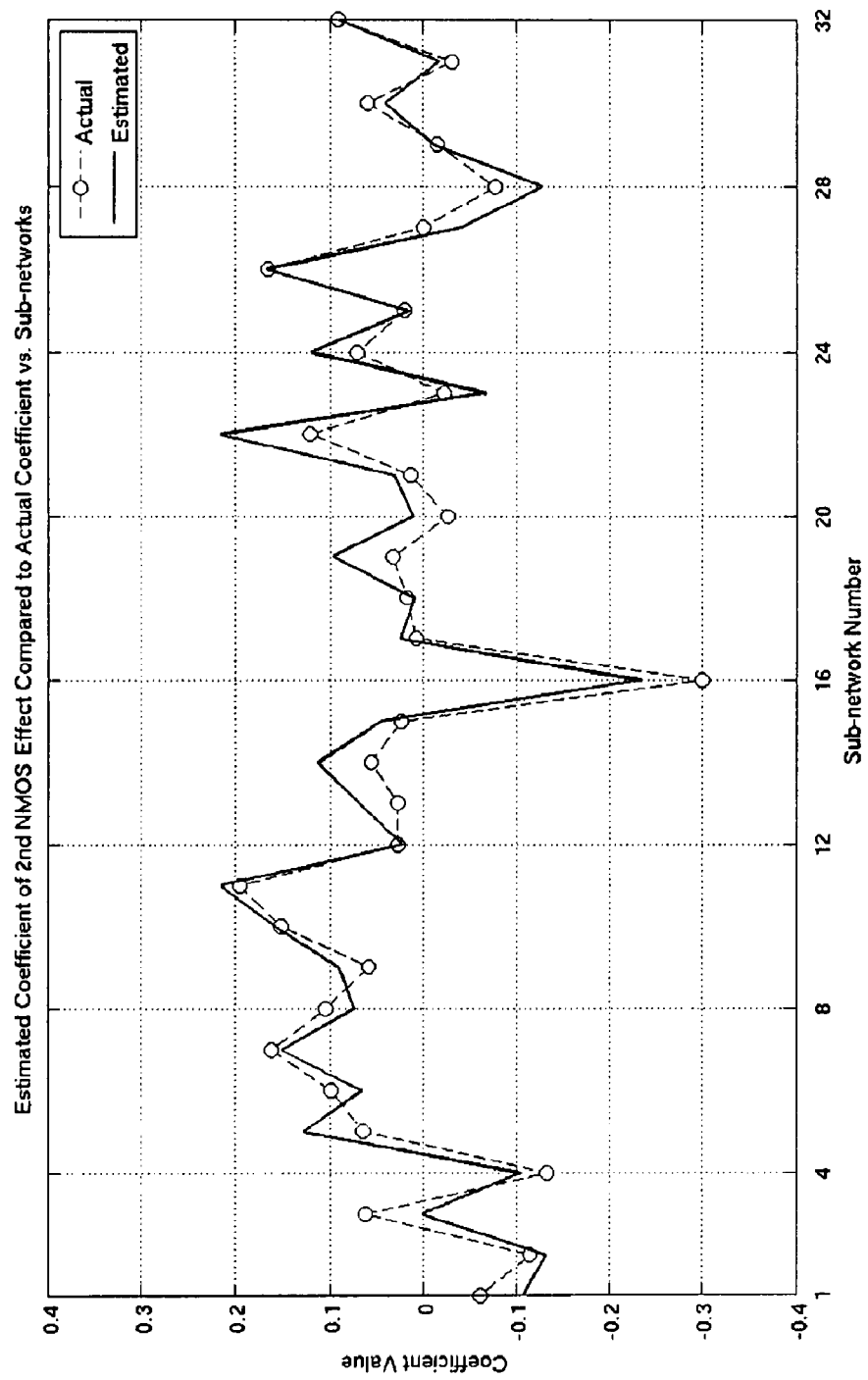
Figure 29:
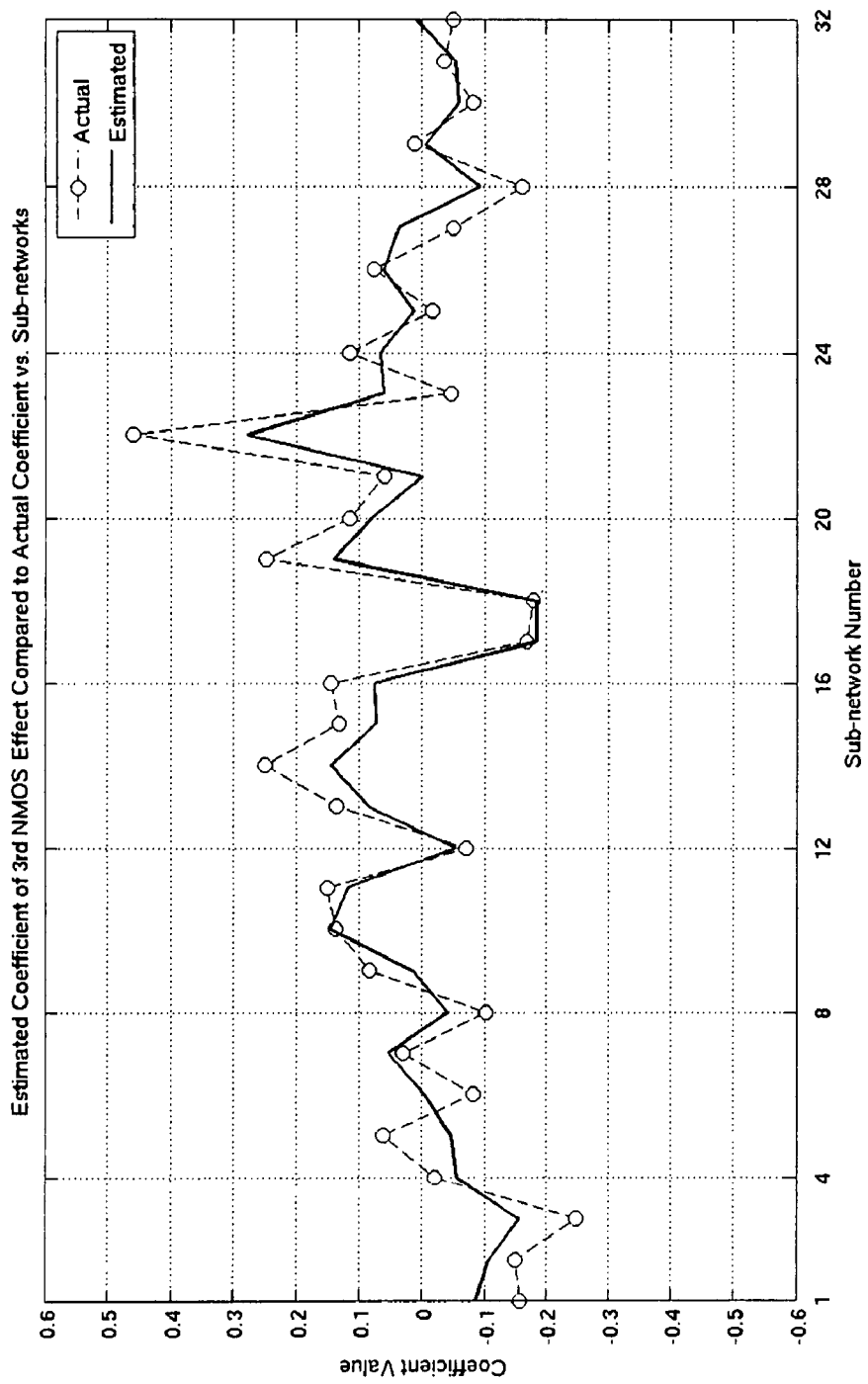
Figure 30:
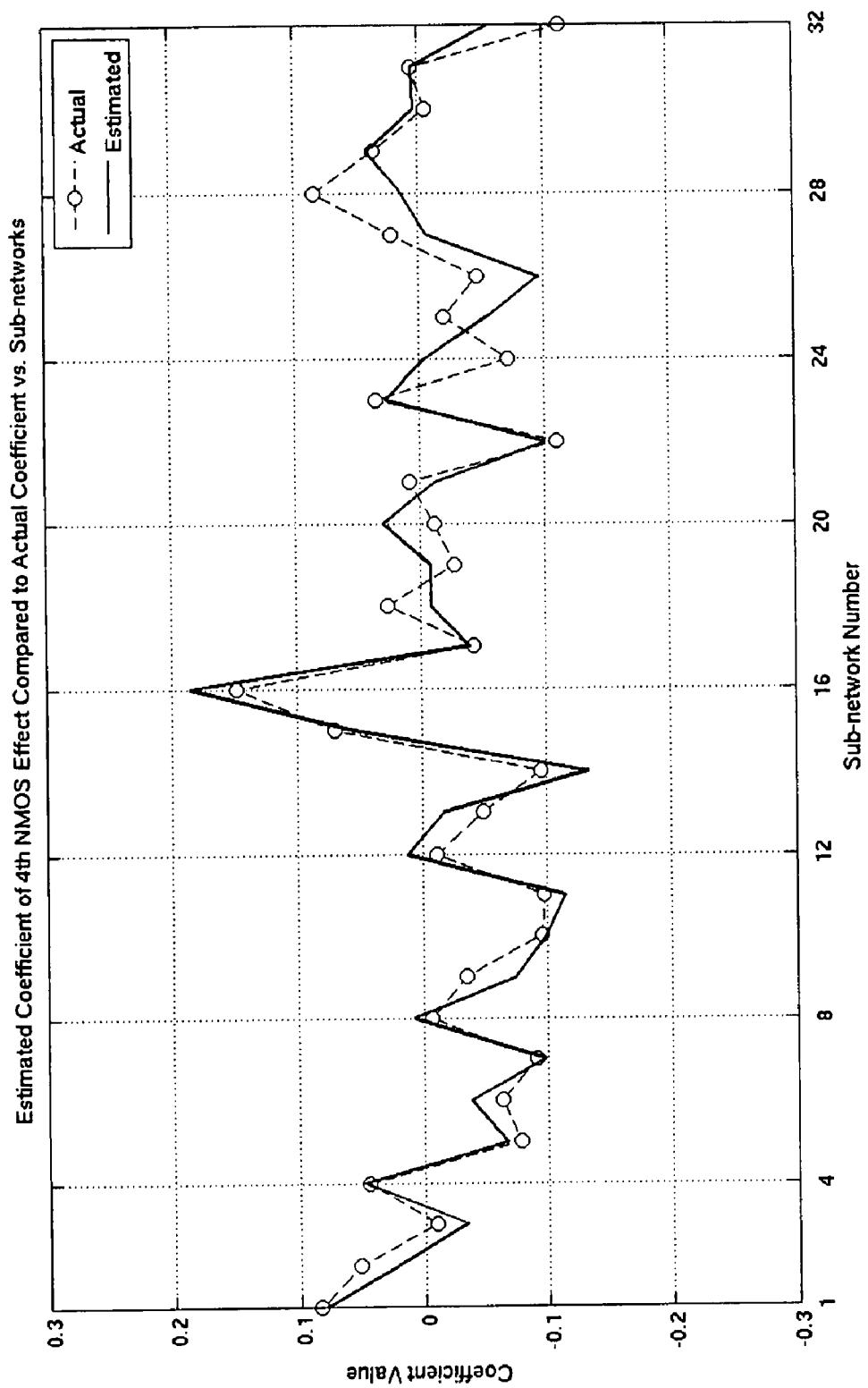
Figure 31:
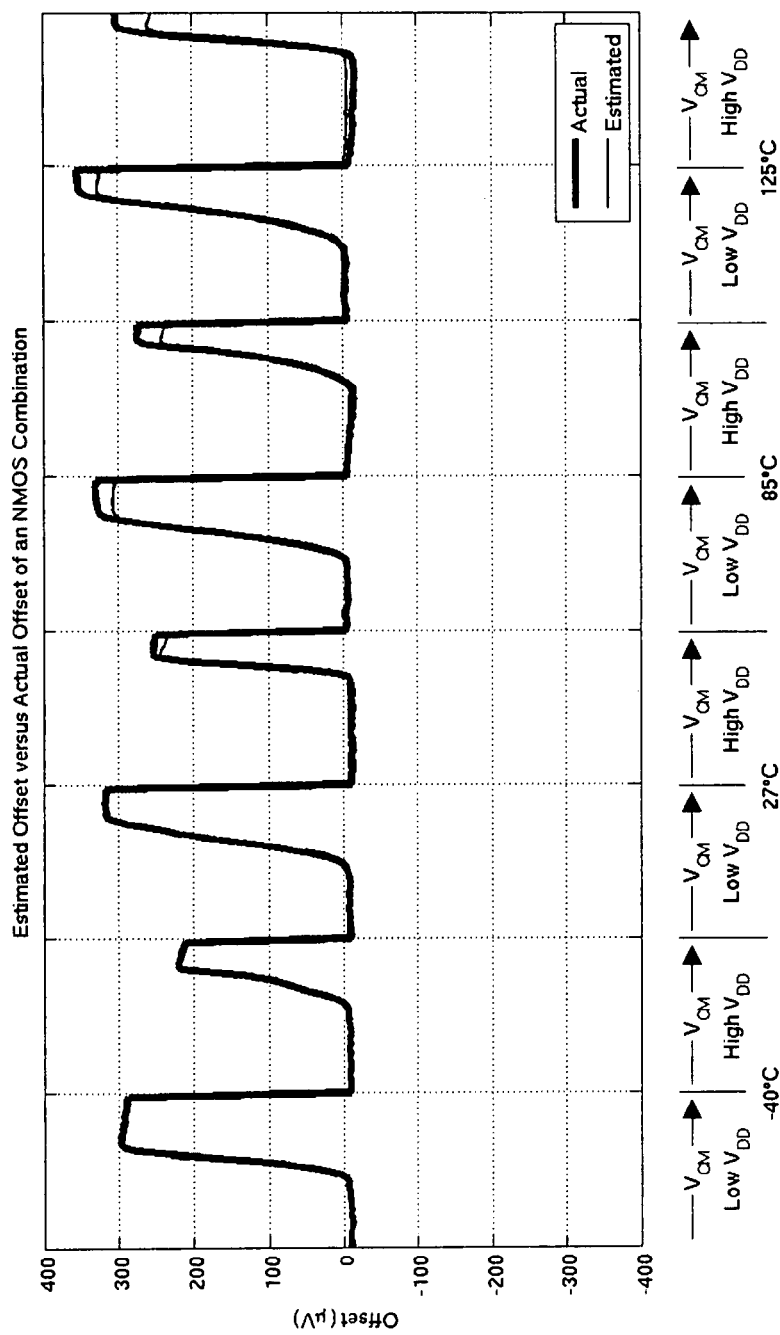
FIG. 31 is a graph illustrating the estimated behavior of one combination of sub-networks versus its actual behavior.
Figure 32:
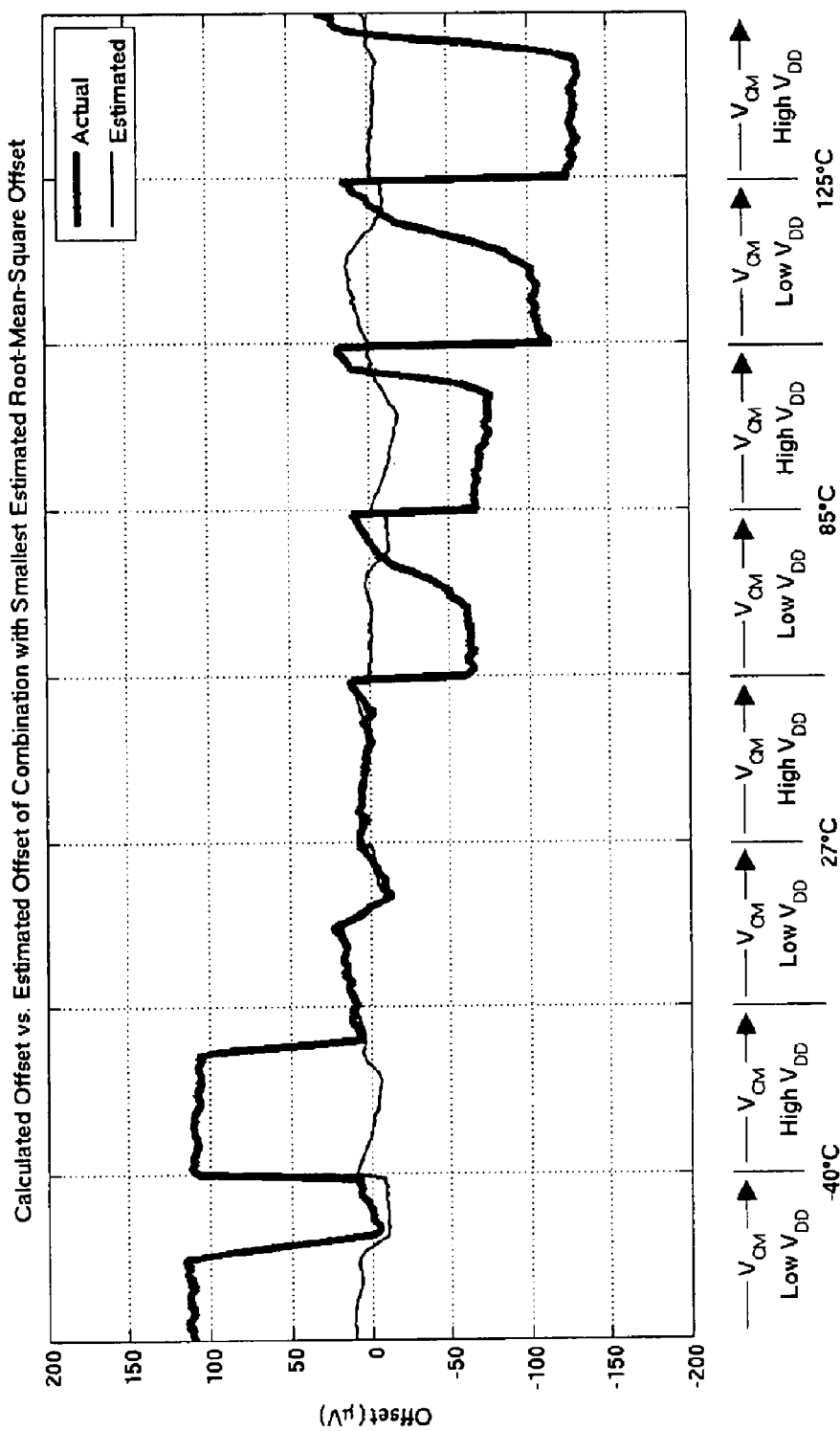
FIG. 32 is a graph illustrating the determination of a combination that will yield the smallest estimated offset against temperature and comparing the estimate to the actual result.

The above formation of an estimator can be better understood by looking at a numerical example, taken from similar amplifiers with sub-networks provided according to the invention. Several amplifiers were measured for their offsets versus temperature, supply voltage and common-mode input voltage. This was done for various combinations of input devices for each amplifier. From this data, it is possible to extract uncorrelated offset processes. Each sub-network in each amplifier has a varying amount of each random process. The effect caused by the four most significant processes is shown in FIG. 25. The same characterization is also done at room temperature. The effects for this characterization are shown in FIG. 26. An estimator is then formed based on the correlation of the room temperature variations to the cross-temperature variations. The estimator can then be used to generate estimates of the cross-temperature coefficients given the room-temperature coefficients. The estimates for the amount of the four cross-temperature processes in each sub-network versus the actual amount of the processes are shown in FIG. 27-FIG. 30. Note that this estimation was done for an amplifier that was not included in the original characterization sample set. FIG. 27-FIG. 30 clearly show that the estimation can yield quite accurate correspondence between room-temperature and cross-temperature effects. FIG. 31 shows the estimated behavior of one combination of sub-networks versus its actual behavior. The estimated sub-network behaviors across temperature were then used to make a determination of a combination that will yield the smallest estimated offset across temperature (in a root-mean-square sense). The result of this determination is shown in FIG. 32. FIG. 32 shows the estimated performance versus the actual performance of the selected sub-network. Note that most of the error is associated with the region of operation (low common-mode input voltage, $V_{CM}$) that was not affected by the sub-networks in question. This example demonstrates the flexibility of the determination step, allowing it to handle procedures that go beyond simple measurement of sub-network behavior.

The final step is to selectively connect particular combinations of sub-networks to form the networks. Based on the determinations of performance of various combinations, certain combinations of interconnection will be chosen. Normally, the combinations which most accurately approximate the desired performance characteristics will be chosen. However, the method does not necessitate the choice of the most accurate approximation.

The interconnection of sub-networks is normally accomplished by means of switches, relays, fuses, or transistors. The interconnection may be static or dynamic. In many implementations, static connections will be programmed by means of programmable or re-programmable memory (e.g., EEPROM) and accompanying logic. The static connections are generally set at one point in time and are not changed.

In some embodiments, the connections will be dynamic; they may change with some other variable such as time or a data input. Crucial to distinguishing this dynamic selection from known techniques such as dynamic element matching is that the selective connections of certain combinations are made after a determination of performance. Methods such as dynamic element matching rely on time-averaging to achieve matching. They make no determination of the performance of the sub-networks.

Figure 33:
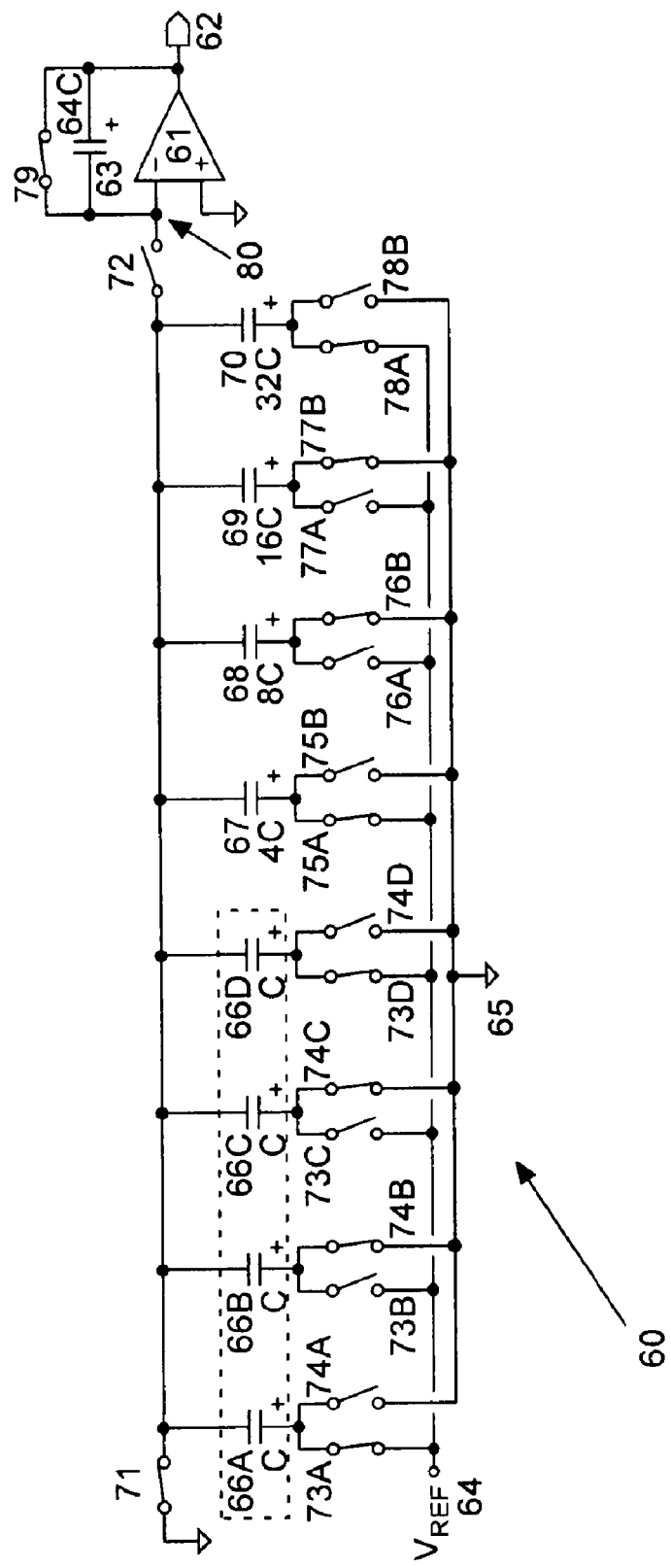
FIG. 33 and FIG. 34 are schematics of a digital-to-analog converter illustrating the application of the invention to a dynamic input data signal, with different respective bit switch status.

One type of dynamic connection of considerable importance is that which depends on a data signal. The invention allows for different combinations to be chosen depending on the input data. FIG. 33 shows an embodiment 60 of a digital-to-analog converter incorporating this concept. The digital-to-analog converter (DAC) of FIG. 33 is of the type known as a charge-redistribution DAC. At the beginning of its conversion cycle, the DAC is provided with a data signal. For this embodiment, this is a 6-bit binary value. The operating principle for the DAC is that during a first step switch 79 closes, thereby discharging hold capacitor 63. Simultaneously, capacitors 66A-66D, 67, 68, 69 and 70 are pre-charged to a voltage of either zero volts or $V_{REF}$ volts. The desired pre-charge value is determined by the input data word. For example, if the most significant bit of the data word is a binary 1, then capacitor 70 would be pre-charged to $V_{REF}$ volts. If it were a binary 0, then it would be pre-charged to zero volts. Similarly, if the fourth most significant bit were a binary 1, capacitor 67 would be pre-charged to $V_{REF}$ volts. Otherwise, if it were a binary 0, it would be pre-charged to zero volts. The pre-charging of capacitors 66A-66D will be discussed in more detail below. The pre-charging operation is accomplished by closing switch 71 and opening switch 72. The pre-charge voltages for the capacitors depend on the settings of switches 73A-73D, 74A-74D, 75A, 75B, 76A, 76B, 77A, 77B, 78A and 79B. For example, if switch 73A is closed, which necessitates that switch 73B be open, then capacitor 66A will be pre-charged to $V_{REF}$ volts. The corresponding charge on the capacitor would be $V_{REF}*C$. An example of a pre-charge to zero volts would be the case when switch 74B is closed and switch 74A is open. This would apply zero volts across the capacitor 66B and store a charge of $0*C$. It should be noted that capacitors 67, 68, 69 and 70 are binary-weighted in value with values $4*C$, $8*C$, $16*C$ and $32*C$, where C is a size determined by design. On the other hand, capacitors 66A-66D are used to form charge storage networks according to the invention. Once the pre-charge step is completed, switches 71 and 79 are opened and switch 72 is closed. Simultaneously, switches 74A-74D, 75B, 76B, 77B and 78B are closed and switches 73A-73D, 74A, 76A, 77A and 78A are opened. This transfers the charge stored on the capacitors 66A-66D, 67, 68, 69 and 70 to the hold capacitor 63. The voltage that then appears across the hold capacitor 63 is its charge divided by its capacitance. Since node 80 is held at the same potential as the ground node 65 by amplifier 61, the voltage appearing at the output terminal 62 will be equal to the voltage on the hold capacitor 63. This voltage will then be proportional to the input data word.

In the exemplary embodiment 60 of FIG. 33, the capacitors 66A-66D are implemented as elements of like kind, capacitors, and like measure, they all have a capacitance of C. The performance characteristic that is desired is that each data input creates a precisely proportional output voltage at terminal 62. Typically, all of the capacitors in FIG. 33 will have a certain amount of variance from their nominal values. This will create errors in the output voltages for some codes. What the invention proposes is that, for a given input in this embodiment, several possible capacitor selections are possible for storing and transferring charge to the hold capacitor. For example, to convert the binary input '100110', switches 78A, 77B, 76B and 75A will be closed and switches 78B, 77A, 76A and 75B will be open. This stores the charge for the four most significant bits (MSB's). The second least significant bits still need an associated charge to be stored. This is accomplished by selectively connecting two of the capacitors from the pool of capacitors 66A-66D based on a determination of which most accurately produces the desired output voltage. In the example of FIG. 33, capacitors 66A and 66D, are shown as being charged to the reference voltage $V_{REF}$. This selection would have been made to best implement the two least significant bits (LSB's) in combination with the other bits. Note that the network topology for the generation of a binary '10' in the LSB's is pre-determined to be two capacitors in parallel; exactly which two are chosen to implement the binary '10' depends on the entire code being converted.

Figure 34:
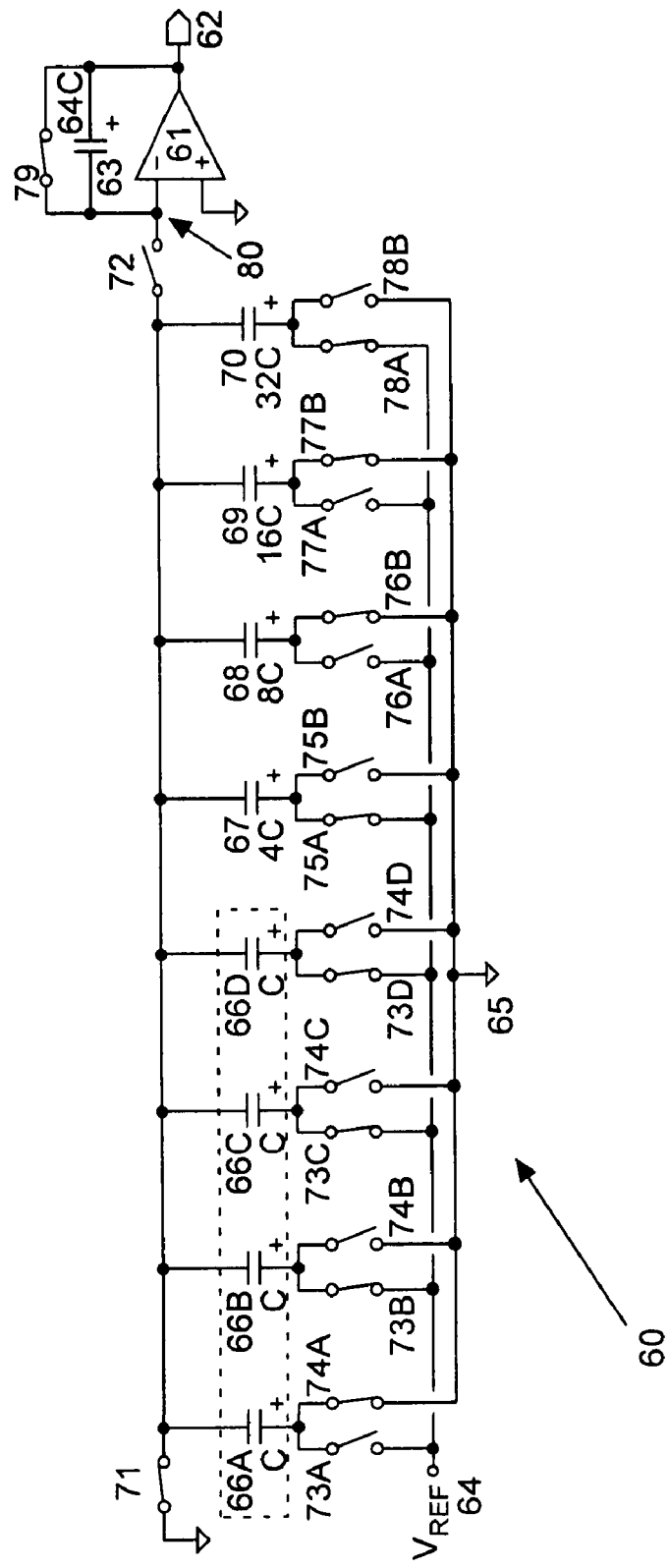

To clarify how selections might be made for the embodiment of the digital-to-analog converter, another exemplary embodiment 60 is illustrated in FIG. 34, which includes elements of the embodiment 60 of FIG. 33 with like elements indicated by like reference numbers. The difference between the two embodiments is the switch positions. The connections shown in would be chosen to convert the binary input '100111' most precisely, after some determination is made. This example differs from that of FIG. 33 in that the input being translated has a binary '11' for the least significant bits. This requires that three capacitors from the pool 66A-66D be pre-charged to $V_{REF}$. In this example, one possible selection using the method is shown. Capacitors 66B, 66C and 66D are pre-charged to $V_{REF}$. Note that although the previous case a binary '10' in the LSB's was formed with capacitors 66A and 66D, in this case 66A is not selected even though the second least significant bit is the same. So for each set of capacitors fabricated, 66A-66D, 67, 68, 69, 70, the switch settings on the pool of devices will vary from input to input. Also for a given input, different sets of fabricated capacitors will use different switch settings according to the method of the invention.

Figure 37:
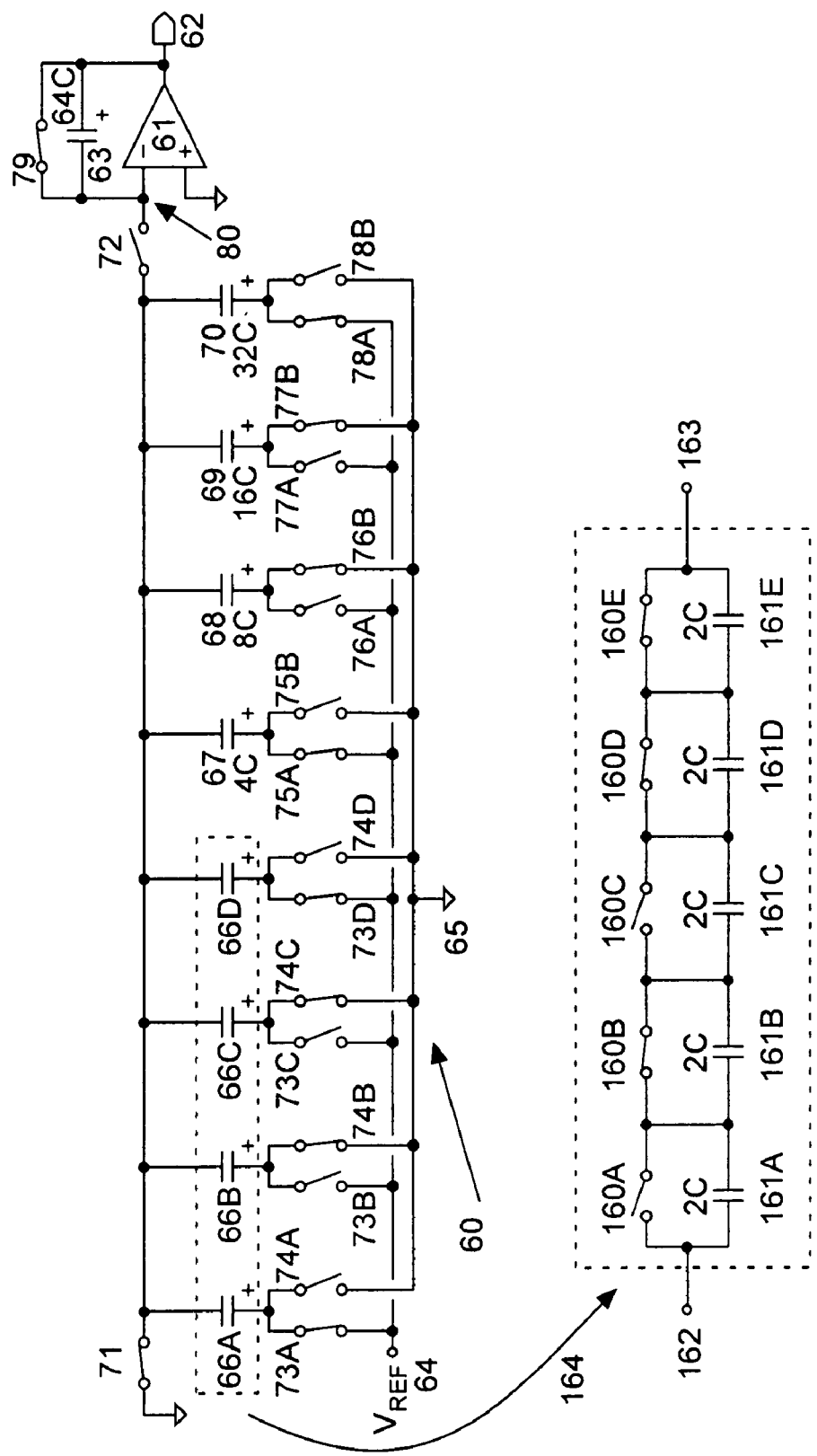
FIG. 37 is a schematic similar to FIG. 33, but illustrating some of the capacitors of FIG. 33 as being formed from respective networks of switched capacitors.

Another exemplary method embodiment 60 is illustrated in FIG. 37, which includes elements of the embodiment 60 of FIG. 33 with like elements indicated by like reference numbers. In embodiment 60 of FIG. 37, capacitive elements 66A-66D are formed from networks 165 as shown by the arrow 164. Networks 165 are comprised of capacitors 161A-161E and switches 160A-160E. The switches are opened or closed so as to selectively connect two capacitors in series according to the invention. This becomes a recursive application of the method in which the sub-networks are formed as networks according to the invention.

It should be clear from several of the exemplary embodiments that the invention can be used to form at least two networks which have a common topology. Specifically, exemplary embodiments 20 of FIG. 1, 20 of FIG. 5, 50 of FIG. 6, 21 of FIGS. 8, 120 and 130 of FIG. 9, 20 of FIGS. 35 and 21 of FIG. 36 all provide examples of networks arranged in a common topology.

The above technique can be modified slightly to allow greater flexibility without departing from the basic idea of the invention. Instead of requiring that the networks be of pre-determined topology, it is possible to provide sub-networks that can be combined in topologically indistinguishable configurations. That is, given at least one pool of sub-networks, it often possible to combine the sub-networks in a variety of topologies. It is only required that for each topology, combinations of the sub-networks be made available to implement the networks. For a given topology, the combinations would be topologically indistinguishable.

Figure 35:
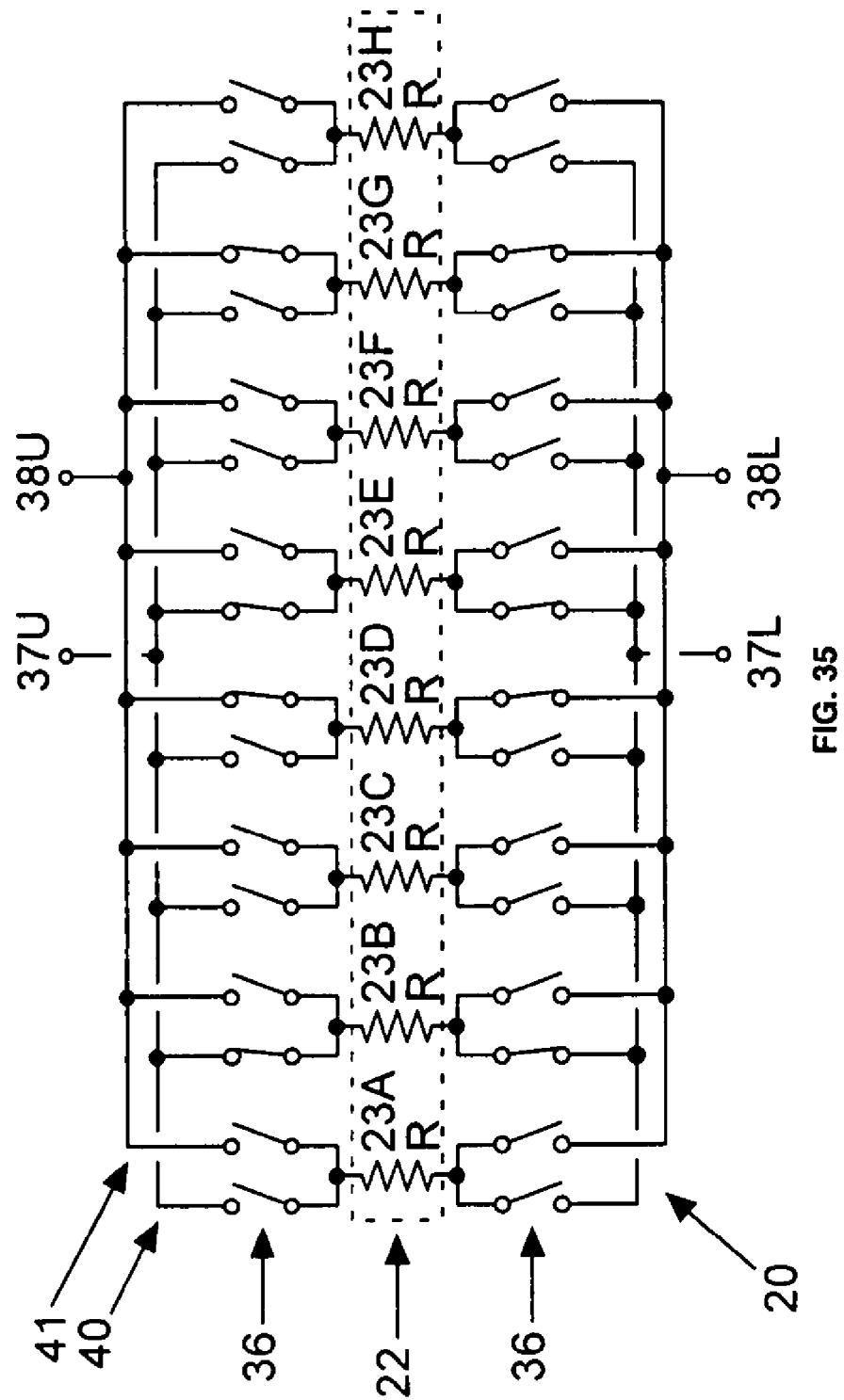
FIG. 35 and FIG. 36 are schematics similar to FIG. 1, but with switch states establishing parallel combinations of two and four resistors, respectively.
Figure 36:
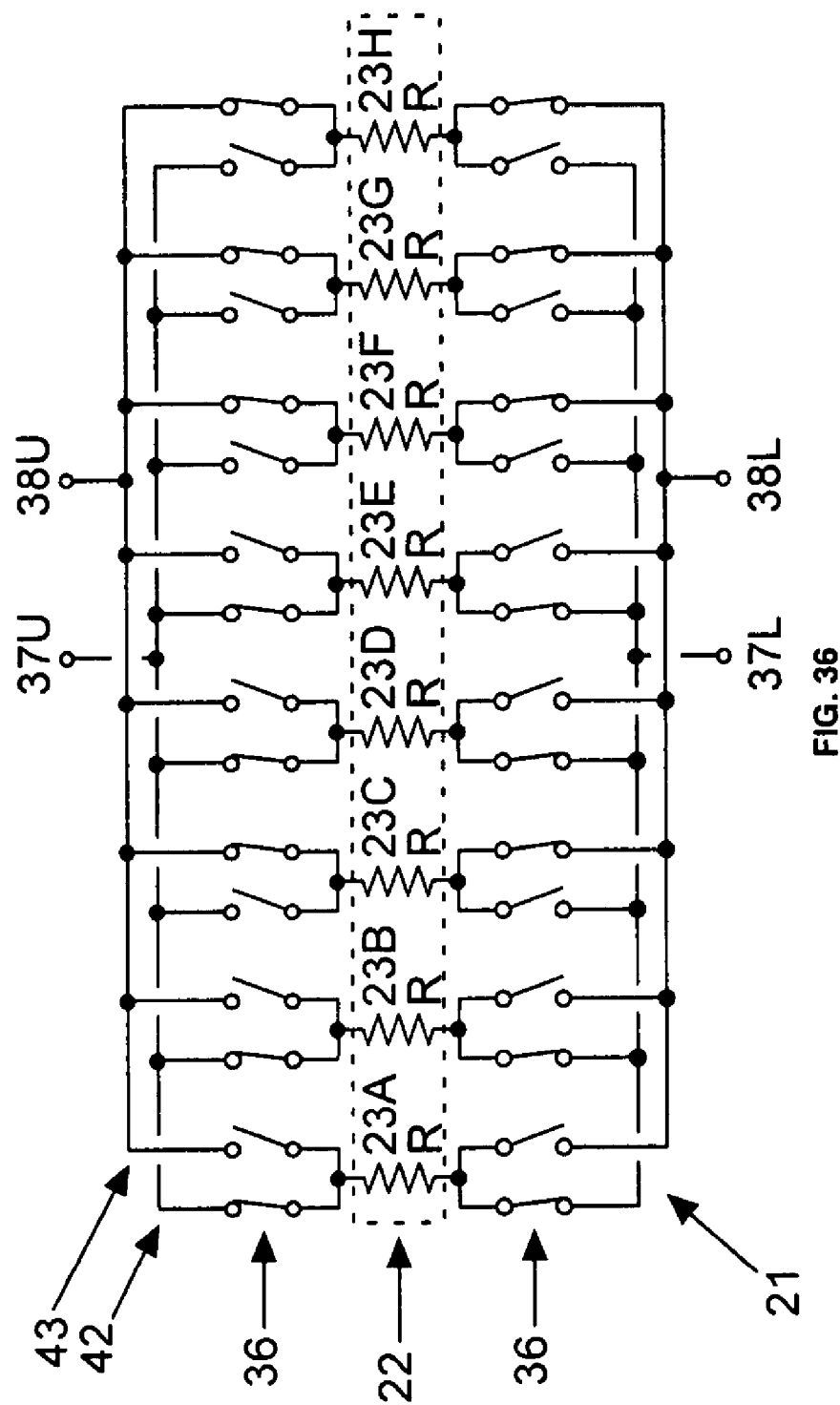

FIG. 35 and FIG. 36 illustrate exemplary embodiments 20 and 21, respectively, which includes elements of the embodiment 20 of FIG. 1 with like elements indicated by like reference numbers. For the purpose of these examples, it should be presumed that the resistors 23A-23H and the bank of switches 36 in each embodiment are identical. For embodiment 20, the networks 40 and 41 to be formed are parallel combinations of two resistors. Clearly the combinations of the resistors forming the networks are topologically indistinguishable from each other. For embodiment 21, the networks 42 and 43 to be formed are parallel combinations of four resistors. Again the combinations forming the networks are topologically indistinguishable from each other. However, the combinations for embodiment 20 are topologically distinguishable from those of embodiment 21. Allowing for different topologies might allow for a performance improvement. In this example, the capability of having networks with two or four resistors in parallel may allow for a better match of the selected networks in cases where the absolute value of the resistors does not matter.

As used above, the terms network and sub-network are broadly intended to refer to single electronic devices and/or interconnected electronic devices.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

What is claimed is:

1. An apparatus comprising:
   a first plurality of switching elements disposed in one or more signal paths between a first node and a second node of an integrated circuit (IC);
   a plurality of circuit sub-networks of like kind and measure, wherein the first plurality of switching elements include control inputs for selection among a first plurality of possible combinations of the circuit sub-networks to electrically connect between the first and second nodes, wherein different combinations of the circuit sub-networks have different observable results for at least one electrical characteristic of the IC; and
   a programmable memory having memory data stored therein, wherein the memory data is associated with a selected state of the control inputs of the first plurality of switching elements, wherein the IC is configured by the memory data to operate with the selected state during operation, wherein the selected state of the control inputs corresponds to a particular combination of the plurality of circuit sub-networks having a reduced variation of the at least one electrical characteristic as compared to at least a second state of the control inputs.

2. The apparatus of claim 1, wherein the selected state of the control inputs corresponds to a particular combination of the circuit sub-networks having a minimum variation of the at least one electrical characteristic as compared to all other states of the control inputs.

3. The apparatus of claim 1, wherein each of the first plurality of possible combinations of the circuit sub-networks comprise an equal number of circuit sub-networks.

4. The apparatus of claim 1, wherein the plurality of circuit sub-networks comprise a plurality of transconductor ($G_m$) circuits.

5. The apparatus of claim 4, further comprising:
a plurality of capacitors;
a second plurality of switching elements disposed in one or more signal paths between the second node and a third node of the IC, wherein the second plurality of switching elements include control inputs for selection among a plurality of possible combinations of the capacitors to electrically connect between the second and third nodes, wherein the programmable memory is further configured to store memory data corresponding to a particular combination of the capacitors to electrically connect between the second and third nodes of the IC.

6. The apparatus of claim 1, wherein the plurality of circuit sub-networks comprise a plurality of resistors.

7. The apparatus of claim 1, wherein the plurality of circuit sub-networks comprise a plurality of capacitors.

8. The apparatus of claim 1, further comprising:
a second plurality of switching elements disposed in one or more signal paths between said first node and a third node of the IC, wherein the second plurality of switching elements include control inputs for selection among a second plurality of possible combinations of the circuit sub-networks to electrically connect between the first and third nodes,
wherein the programmable memory is further configured to store memory data corresponding to a particular combination of the circuit sub-networks to electrically connect between the first and third nodes of the IC.

9. The apparatus of claim 8, wherein the plurality of circuit sub-networks comprise a plurality of resistors, the apparatus further comprising:
a differential pair of transistors comprising a first transistor and a second transistor, wherein the first transistor includes one of a drain or a collector electrically connected to the second node, and wherein the second transistor includes one of a drain or a collector electrically connected to the third node.

10. The apparatus of claim 8, wherein the plurality of circuit sub-networks comprises a plurality of transistors, wherein the programmable memory is further configured to store memory data corresponding to a particular combination of the transistors.

11. The apparatus of claim 10, wherein the plurality of transistors is configured to operate in a differential pair.

12. The apparatus of claim 10, wherein the plurality of transistors is configured to operate as transistor current sources.

13. The apparatus of claim 10, wherein the plurality of transistors is configured to operate in a current mirror.

14. The apparatus of claim 8, wherein the first plurality of possible combinations of the circuit sub-networks and the second plurality of possible combinations of the circuit sub-networks are the same.

15. The apparatus of claim 8, wherein the first plurality of possible combinations of the circuit sub-networks and the second plurality of possible combinations of the circuit sub-networks are different.

16. The apparatus of claim 1, further comprising:
a second plurality of switching elements disposed in one or more signal paths between a third node and a fourth node of the IC, wherein the second plurality of switching elements include control inputs for selection among a second plurality of possible combinations of the circuit sub-networks to electrically connect between the third and fourth nodes,
wherein the programmable memory is further configured to include memory data corresponding to a particular combination of the circuit sub-networks to electrically connect between the third and fourth nodes of the IC, and wherein the first node, second node, third node and fourth node are associated with a differential circuit of the IC.

17. The apparatus of claim 16, wherein the first plurality of possible combinations of the circuit sub-networks and the second plurality of possible combinations of the circuit sub-networks are the same.

18. The apparatus of claim 16, wherein the first plurality of possible combinations of the circuit sub-networks and the second plurality of possible combinations of the circuit sub-networks are different.

19. The apparatus of claim 1, wherein the each of the plurality of circuit sub-networks comprise two or more circuit elements in series.

20. The apparatus of claim 1, wherein the each of the plurality of circuit sub-networks comprise two or more circuit elements in parallel.

21. The apparatus of claim 1, wherein the programmable memory stores data corresponding to particular combinations of the circuit sub-networks for which a characteristic of the at least one electrical characteristic is desirable across at least two or more different values of at least one operating variable.

22. The apparatus of claim 1, wherein the plurality of circuit sub-networks comprise a plurality of metal oxide semiconductor (MOS) transistors.

23. The apparatus of claim 1, wherein the plurality of circuit sub-networks comprise a plurality of bipolar transistors.

24. An apparatus comprising:
a first plurality of switching elements disposed in one or more signal paths between a first node and a second node of an integrated circuit (IC);
a plurality of circuit sub-networks of like kind and measure, wherein the first plurality of switching elements include control inputs for selection among a first plurality of possible combinations of the circuit sub-networks to electrically connect between the first and second nodes, wherein different combinations of the circuit sub-networks have different observable results for at least one electrical characteristic of the IC; and
a programmable memory having data stored therein, wherein the data is associated with a plurality of selected states of the control inputs of the first plurality of switching elements, wherein at least one of the plurality of selected states of the control inputs corresponds to a particular combination of the plurality of circuit sub-networks having a reduced variation of the at least one electrical characteristic as compared to at least a second state of the control inputs,
wherein the IC is configured to operate with one of the plurality of selected states at a given time during operation, wherein the one of the plurality of selected states the IC operates with at the given time is based on the memory data and on input data of the IC.

25. The apparatus of claim 24, wherein the plurality of circuit sub-networks comprise a plurality of capacitors.

26. The apparatus of claim 25, further comprising a digital-to-analog converter (DAC), wherein the DAC is configured to convert a digital input signal into an analog output signal in part by controlling a charge across at least a portion of the plurality of capacitors, wherein the input data of the IC comprises an input data signal of the DAC.

* * * * *